US012602139B2

(12) United States Patent
Liu et al.

(10) Patent No.: US 12,602,139 B2
(45) Date of Patent: Apr. 14, 2026

(54) DISPLAY PANEL AND DISPLAY DEVICE

(71) Applicants: Wuhan Tianma Microelectronics Co., Ltd., Wuhan (CN); Wuhan Tianma Microelectronics Co., Ltd. Shanghai Branch, Shanghai (CN)

(72) Inventors: Jia Liu, Wuhan (CN); Zhiyong Xiong, Wuhan (CN)

(73) Assignees: Wuhan Tianma Microelectronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 38 days.

(21) Appl. No.: 18/737,405

(22) Filed: Jun. 7, 2024

(65) Prior Publication Data

US 2024/0329790 A1     Oct. 3, 2024

(30) Foreign Application Priority Data

Jun. 7, 2023     (CN) .......................... 202310675566.3

(51) Int. Cl.
| | |
|---|---|
| *G06F 3/047* | (2006.01) |
| *G06F 3/041* | (2006.01) |
| *G06F 3/044* | (2006.01) |
| *H10K 59/40* | (2023.01) |

(52) U.S. Cl.
CPC ............ *G06F 3/047* (2013.01); *G06F 3/0412* (2013.01); *G06F 3/0446* (2019.05); *H10K 59/40* (2023.02)

(58) Field of Classification Search
CPC ...... G06F 3/047; G06F 3/0446; G06F 3/0412; H10K 59/04
See application file for complete search history.

(56) References Cited

U.S. PATENT DOCUMENTS

| | | | |
|---|---|---|---|
| 11,456,348 B2 * | 9/2022 | Bang | .................... H10K 59/131 |
| 2019/0280054 A1 * | 9/2019 | Huang | .................. G06F 1/1637 |
| 2022/0164051 A1 * | 5/2022 | Lee | ....................... G06F 3/0412 |
| 2024/0256095 A1 * | 8/2024 | Luo | ......................... G06F 3/041 |

FOREIGN PATENT DOCUMENTS

| | | | | |
|---|---|---|---|---|
| CN | 204242157 U | 4/2015 | | |
| CN | 107992229 A | 5/2018 | | |
| EP | 3316103 A1 * | 5/2018 | ......... | G02F 1/13338 |

* cited by examiner

*Primary Examiner* — Stacy Khoo
(74) *Attorney, Agent, or Firm* — KDW FIRM PLLC

(57) ABSTRACT

Provided are a display panel and a display device. The display panel includes a plurality of touch electrode blocks and a plurality of touch wires. The plurality of touch wires are electrically connected to the plurality of touch electrode blocks correspondingly. The display panel further includes a display region and a non-display region disposed on at least one side of the display region. The plurality of touch electrode blocks are disposed in the display region. The plurality of touch wires include a plurality of first touch wires, at least part of the first touch wire is disposed in the display region, and at least two of the first touch wires are disposed in different films.

20 Claims, 24 Drawing Sheets

— 80

— 81

DISPLAY PANEL AND DISPLAY DEVICE

CROSS-REFERENCE TO RELATED APPLICATION(S)

This application claims the priority of a Chinese Patent Application No. 202310675566.3, filed on Jun. 7, 2023, the disclosure of which is incorporated herein by reference in its entirety.

TECHNICAL FIELD

The present disclosure relates to the field of display technology and, in particular, to a display panel and a display device.

BACKGROUND

In existing touch display panels, touch wires connected to touch electrodes are typically led to a bonding region through a non-display region on the periphery of a display region. As a result, a relatively wide non-display region needs to be provided on the periphery of the display region to provide sufficient wiring space for the touch wires, affecting the screen-to-body ratio of a display panel and resulting in a failure to meet the requirement for a narrow bezel or no bezel.

SUMMARY

The present disclosure provides a display panel and a display device.

According to one aspect of the present disclosure, a display panel is provided. The display panel includes multiple touch electrode blocks and multiple touch wires, where a touch wire of the multiple touch wires is electrically connected to a touch electrode block of the multiple touch electrode blocks.

The display panel also includes a display region and a non-display region disposed on at least one side of the display region, where the multiple touch electrode blocks are disposed in the display region.

The multiple touch wires include multiple first touch wires, where at least part of a first touch wire of the first touch wires is disposed in the display region.

At least two of the first touch wires are disposed in different films.

According to another aspect of the present disclosure, a display device is provided, including the display panel as described in the first aspect.

It is to be understood that the contents described in this part are neither intended to identify key or important features of the embodiments of the present disclosure nor intended to limit the scope of the present disclosure. Other features of the present disclosure are to become readily understood through the description hereinafter.

BRIEF DESCRIPTION OF DRAWINGS

To illustrate technical solutions in embodiments of the present disclosure more clearly, the drawings used in the description of the embodiments are briefly described below. Apparently, the drawings described below merely illustrate part of the embodiments of the present disclosure, and those of ordinary skill in the art may obtain other drawings based on the drawings on the premise that no creative work is done.

DETAILED DESCRIPTION

Technical solutions in embodiments of the present disclosure are described clearly and completely below in conjunction with the drawings in the embodiments of the present disclosure from which the solutions of the present disclosure are better understood by those skilled in the art.

Apparently, the embodiments described below are part, not all, of the embodiments of the present disclosure. Based on the embodiments of the present disclosure, all other embodiments obtained by those of ordinary skill in the art on the premise that no creative work is done are within the scope of the present disclosure.

It is to be noted that terms "first", "second" and the like in the description, claims and drawings of the present disclosure are used for distinguishing between similar objects and are not necessarily used for describing a particular order or sequence. It is to be understood that the data used in this manner are interchangeable where appropriate so that the embodiments of the present disclosure described herein may also be implemented in a sequence not illustrated or described herein. In addition, terms "including" and "having" and any other variations thereof are intended to encompass a non-exclusive inclusion. For example, a process, method, system, product or device that includes a series of steps or units not only includes the expressly listed steps or units but may also include other steps or units that are not expressly listed or are inherent to such process, method, product or device.

Figure 1:
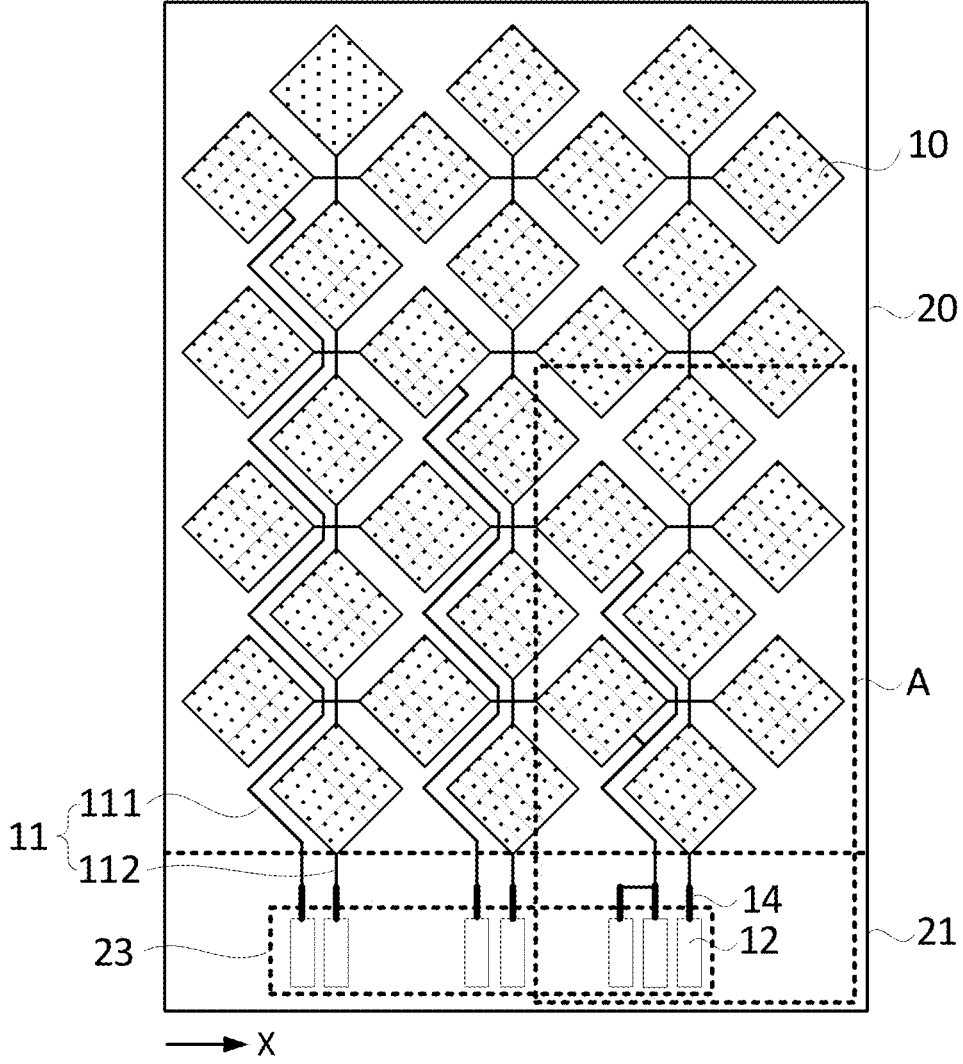
FIG. 1 is a structure diagram of a display panel according to an embodiment of the present disclosure.
Figure 2:
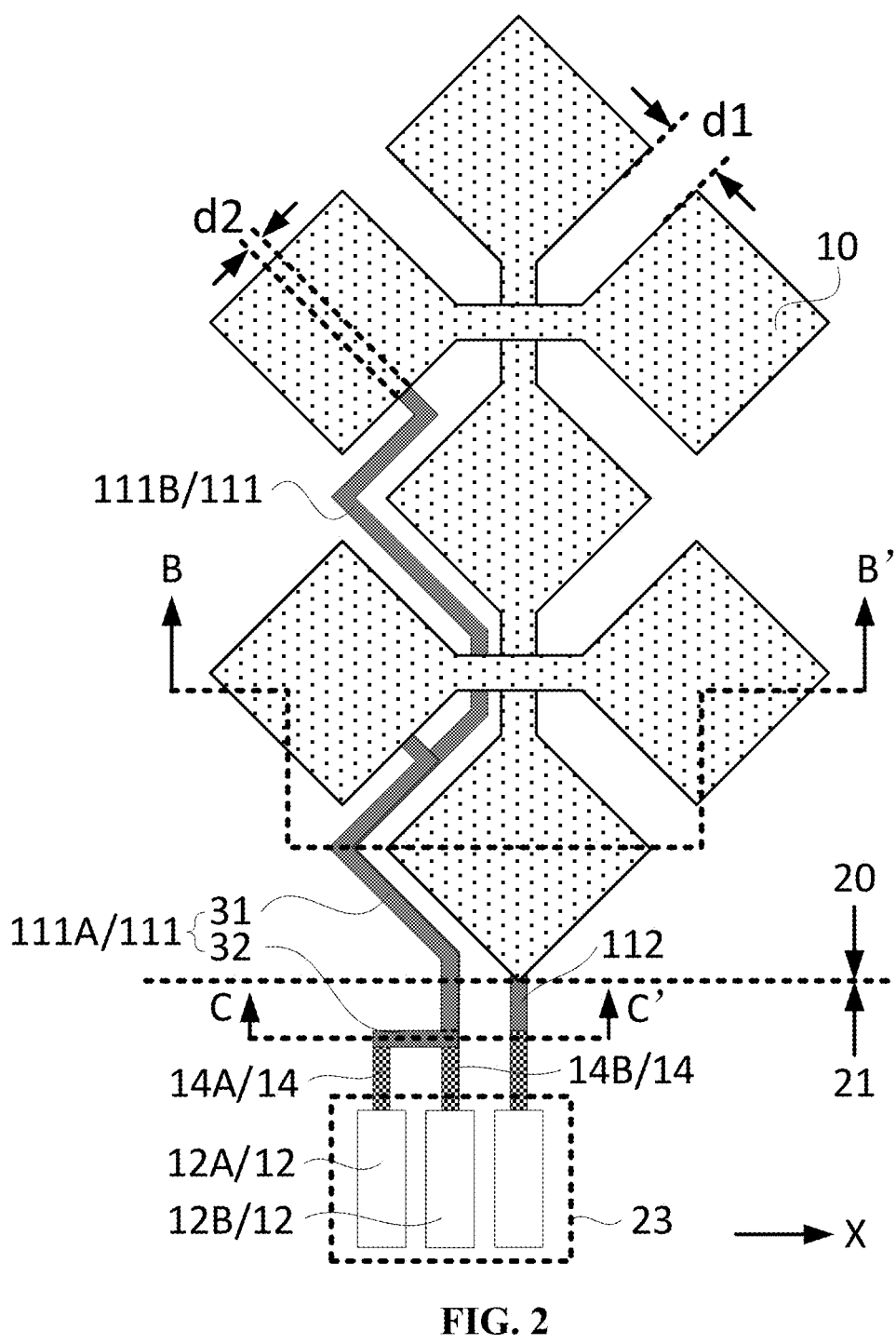
FIG. 2 is an enlarged structure diagram of region A in FIG. 1.
Figure 3:
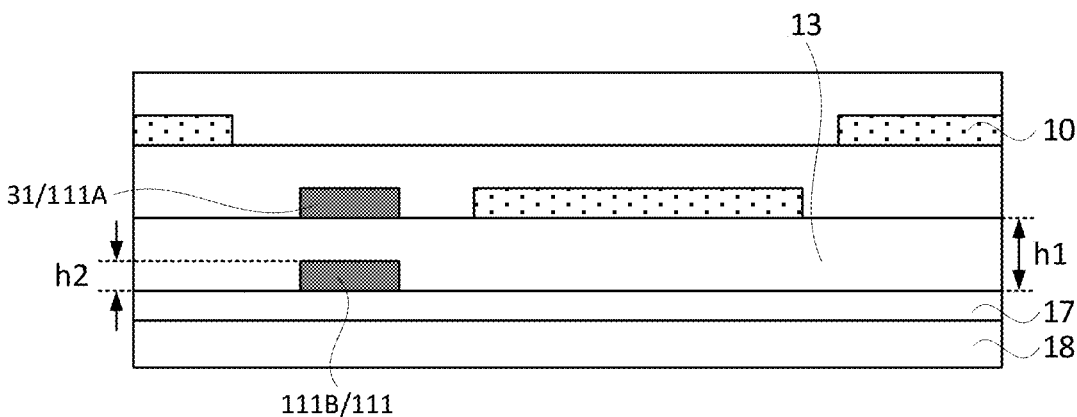
FIG. 3 is a sectional view of FIG. 2 taken along a line B-B'.
Figure 4:
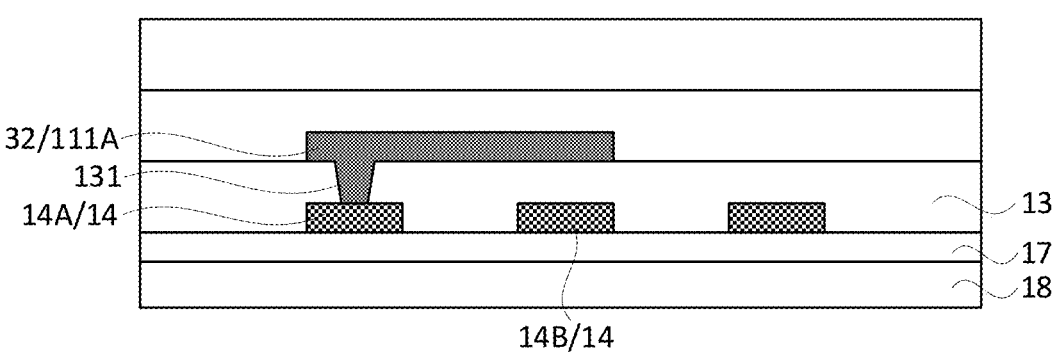
FIG. 4 is a sectional view of FIG. 2 taken along a line C-C'.

FIG. 1 is a structure diagram of a display panel according to an embodiment of the present disclosure. FIG. 2 is an enlarged structure diagram of region A in FIG. 1. FIG. 3 is a sectional view of FIG. 2 taken along a direction B-B'. FIG. 4 is a sectional view of FIG. 2 taken along a direction C-C'. As shown in FIGS. 1 to 4, the display panel according to the embodiment of the present disclosure includes multiple touch electrode blocks 10 and multiple touch wires 11, where a touch wire of the multiple touch wires 11 is electrically connected to at least one touch electrode block of the multiple touch electrode blocks 10 correspondingly. The display panel also includes a display region 20 and a non-display region 21 disposed on at least one side of the display region 20, where the multiple touch electrode blocks 10 are disposed in the display region 20. The multiple touch wires 11 include multiple first touch wires 111, where at least part of a first touch wire of the first touch wires 111 is disposed in the display region 20. At least two of the first touch wires 111 are disposed in different films.

The display region 20 is a region capable of emitting light for display and provided with sub-pixels.

As shown in FIGS. 1 to 4, the display region 20 is also provided with the multiple touch electrode blocks 10, and each touch electrode block 10 is electrically connected to a touch wire 11 correspondingly. Touch driving signals may be sent to the touch electrode blocks 10 and/or touch sensing signals may be received through the touch wires 11, so as to implement the touch function of the display region 20.

The non-display region 21 is disposed on at least one side of the display region 20 and is used for providing bonding pads 12 bonded to a touch chip. The touch wires 11 need to be led to the bonding pads 12 to be electrically connected to the bonding pads 12. The bonding pads 12 are bonded and connected to the touch chip so that electrical connections between the touch electrode blocks 10 and the touch chip can be achieved through a bonding process, that is, each touch electrode block 10 is electrically connected to a bonding pad 12 through the touch wire 11 connected correspondingly and then electrically connected to the touch chip. The touch chip sends the touch driving signals to the touch electrode blocks 10 and receives the touch sensing signals from the touch electrode blocks 10, thereby implementing the touch function.

Figure 5:
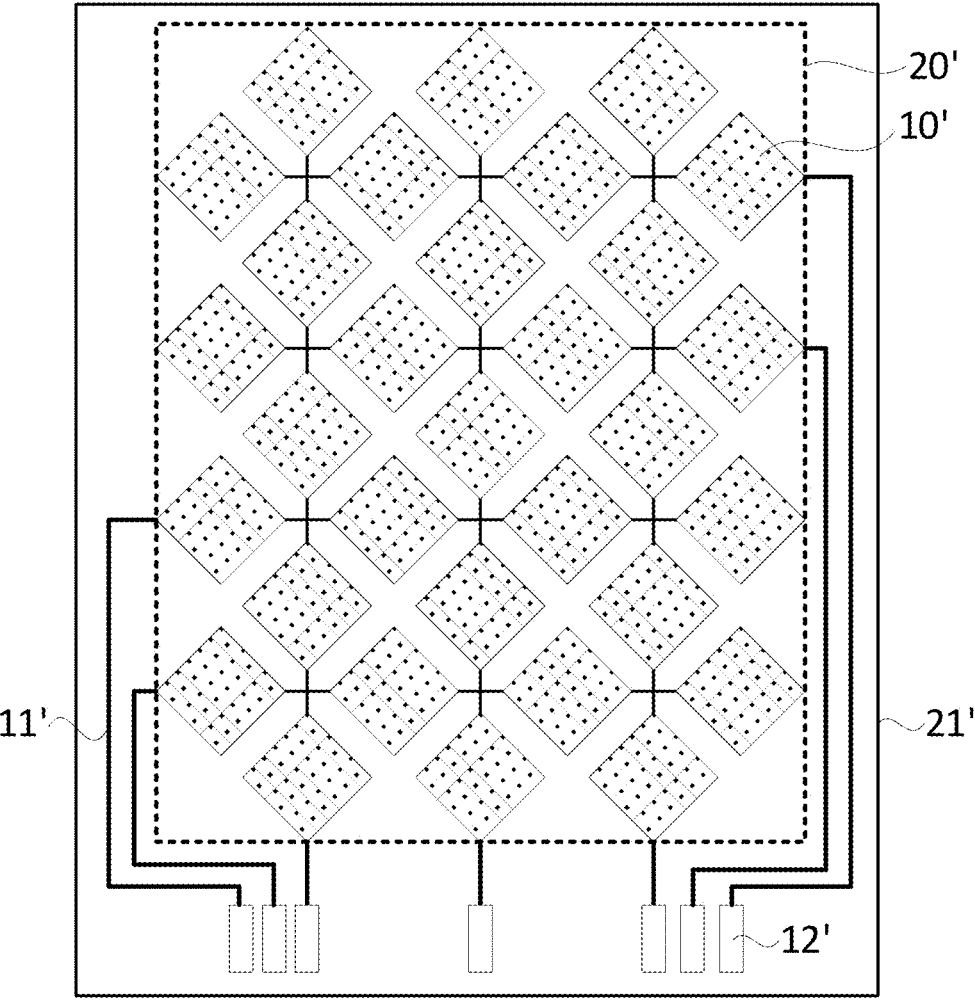
FIG. 5 is a structure diagram of a display panel in the related art.

FIG. 5 is a structure diagram of a display panel in the related art. As shown in FIG. 5, a touch chip is usually bonded in a non-display region 21' below a display region 20', and bonding pads 12' are also usually disposed in the non-display region 21' below the display region 20'. A large number of touch wires 11' connected to touch electrodes 10' are led through non-display regions 21' on the left and right sides of the display region 20' to the bonding pads 12' below the display region 20'. Therefore, relatively wide non-display regions 21' need to be disposed on two sides of the display region 20' to provide enough wiring space for the touch wires 11', affecting the screen-to-body ratio of the display panel and resulting in a failure to meet the requirement for a narrow bezel or no bezel.

Based on the preceding technical problems, as shown in FIGS. 1 to 4, in the embodiment of the present disclosure, at least one touch wire 11 is configured to be a first touch wire 111, and at least part of the first touch wire 111 is disposed in the display region 20, that is, at least one touch wire 11 (that is, the first touch wire 111) is configured to be led to the bonding pad 12 through the display region 20 so that at least part of the touch wires 11 is moved to the display region 20 from the non-display region 21, thereby reducing the wiring area of the touch wires 11 in the non-display region 21, reducing the width of the non-display region 21, increasing the screen-to-body ratio, and helping to meet the requirement for the narrow bezel or no bezel.

With continued reference to FIGS. 1 to 4, the inventors have found that with the requirement for higher touch accuracy, the number of touch electrode blocks 10 increases, and the number of touch wires 11 also increases. To reduce the width of the non-display region 21 as much as possible and increase the screen-to-body ratio, a large number of touch wires 11 need to be configured to be the first touch wires 111 wired through the display region 20. However, with dense sub-pixels disposed in the display region 20, to prevent the first touch wires 111 from obstructing an emissive region of the sub-pixels in the display region 20 and causing a relatively large impact on the display effect of the display region 20, the first touch wires 111 need to avoid the emissive region of the sub-pixels. Thus, planar space of the display region 20 available for arranging the first touch wires 111 is limited, resulting in a failure to arrange a large number of first touch wires 111.

Based on the preceding technical problem, as shown in FIGS. 1 to 4, in the embodiment of the present disclosure, at least two first touch wires 111 are disposed in different films, that is, the first touch wires 111 are changed from planar wiring in a single film to layered wiring. In this manner, the number of first touch wires 111 in each film can be reduced, thereby reducing the occupied planar space of the first touch wires 111 in the display region 20. Therefore, more first touch wires 111 can be accommodated in the display region 20 when the first touch wires 111 are prevented from having a relatively large impact on the display effect of the display region 20, thereby reducing the number of touch wires 11 in the non-display region 21, reducing the width of the non-display region 21, increasing the screen-to-body ratio, and helping to meet the requirement for the narrow bezel or no bezel.

It is to be noted that all the first touch wires 111 may be arranged in two films or may be arranged in more films. For example, the number of films for arranging the first touch wires 111 may be the same as the number of first touch wires 111, that is, each first touch wire 111 is separately disposed in one film, and any two first touch wires 111 are disposed in different films, but it is not limited thereto.

It is to be understood that the smaller the number of films for arranging the first touch wires 111, the better the thickness of the display panel is reduced, which is beneficial for designing a light and thin display panel; the larger the number of films for arranging the first touch wires 111, the smaller the number of first touch wires 111 in each film, and the better the occupied planar space of the first touch wires 111 in the display region 20 is reduced. Therefore, more first touch wires 111 can be accommodated in the display region 20 when the first touch wires 111 are prevented from having a relatively large impact on the display effect of the display region 20, thereby reducing the number of touch wires 11 in the non-display region 21, reducing the width of the non-display region 21, and increasing the screen-to-body ratio. The number of films for arranging the first touch wires 111 is not limited in the embodiment of the present disclosure.

With continued reference to FIGS. 1 to 4, along a thickness direction of the display panel, a first insulating layer 13 is disposed between first touch wires 111 in adjacent films, where the first insulating layer 13 is used for ensuring that metal layers in the adjacent films are insulated, so as to avoid signal crosstalk.

As shown in FIG. 3, the thickness of the first insulating layer 13 is h1, the thickness of the first touch wire 111 is h2, and it may be set that $h1>2*h2$, so as to ensure that the first insulating layer 13 can completely cover the first touch wire 111 and prevent the first touch wire 111 from being exposed to cause a short circuit between the first touch wires 111 in the adjacent films.

In summary, according to the display panel provided by the embodiment of the present disclosure, at least one touch wire is configured to be the first touch wire, and at least part of the first touch wire is disposed in the display region so that at least part of the touch wires is moved to the display region from the non-display region, thereby reducing the wiring area of the touch wires in the non-display region and reducing the width of the non-display region. Meanwhile, at least two first touch wires are disposed in different films so that the number of first touch wires in each film is reduced, thereby reducing the occupied planar space of the first touch wires in the display region. In this manner, more first touch wires can be accommodated in the display region when the first touch wires are prevented from having a relatively large impact on the display effect of the display region, thereby further reducing the number of touch wires in the non-display region, reducing the width of the non-display region, increasing the screen-to-body ratio, and meeting the requirement for the narrow bezel or no bezel.

With continued reference to FIGS. 1 to 3, optionally, along the thickness direction of the display panel, the at least two first touch wires 111 disposed in different films at least partially overlap each other.

Specifically, as shown in FIGS. 2 and 3, along the thickness direction of the display panel, the at least two first touch wires 111 disposed in different films are configured to overlap each other so that the blocking area of the first touch wires 111 along the thickness direction of the display panel is reduced, which is beneficial for reducing the impact of the first touch wires 111 on the display effect of the display region 20.

It is to be noted that in a top view provided in the embodiment of the present disclosure (for example, as shown in FIG. 1), a coinciding part between the touch wires 11 electrically connected to different touch electrode blocks 10 refers to an overlapping part along the thickness direction of the display panel, and the touch wires 11 are disposed in different films and are not connected. This is no longer repeated subsequently.

With continued reference to FIGS. 1 to 4, optionally, the non-display region 21 includes a bonding region 23 disposed on a side of the display region 20, the non-display region 21 includes multiple connection wires 14, and the bonding region 23 includes multiple bonding pads 12, where a touch wire 11 of the touch wires 11 is electrically connected to a connection wire 14 of the connection wires 14 correspondingly, a connection wire 14 of the connection wires 14 is electrically connected to a bonding pad 12 of the bonding pads 12 correspondingly, and the multiple connection wires 14 are disposed in the same film.

Specifically, as shown in FIGS. 1 to 4, the bonding region 23 is disposed on a side of the display region 20, the bonding region 23 is provided with the multiple bonding pads 12, and the bonding pad 12 may be a single-layer structure or a multi-layer structure. The multiple bonding pads 12 are bonded to the touch chip so that the bonding pads 12 and the touch chip are electrically connected.

Further, the touch wires 11 connected to the touch electrode blocks 10 are connected to the bonding pads 12 through the connection wires 14 in the non-display region 21 so that the touch electrode blocks 10 and the touch chip are electrically connected, and the touch chip sends the touch driving signals to the touch electrode blocks 10 and receives the touch sensing signals from the touch electrode blocks 10 through the connection wires 14 and the touch wires 11, thereby implementing the touch function.

For ease of bonding, the multiple bonding pads 12 have the same film structure, and the multiple bonding pads 12 are disposed in the same film. However, at least two first touch wires 111 of the touch wires 11 are disposed in different films. To achieve the electrical connections between the first touch wires 111 disposed in different films and the bonding pads 12, the first touch wires 111 disposed in different films need to be led into the same film.

In the present embodiment, the multiple connection wires 14 are provided and are disposed in the same film. The touch wires 11 are electrically connected to the connection wires 14 correspondingly so that the first touch wires 111 disposed in different films are led into the same film, thereby facilitating the subsequent electrical connection and bonding operations with the bonding pads 12.

It is to be noted that being disposed in the same film, that is, arranged in the same layer in the embodiment of the present disclosure refers to being manufactured by using a single patterning process, and the single patterning process refers to a process of forming the required layer structure by performing exposure once. The single patterning process may include processes such as masking, exposure, development, etching and stripping.

Further, first touch wires 111 disposed in the same film as the connection wires 14 may be directly electrically connected to the connection wires 14.

With continued reference to FIG. 4, the first insulating layer 13 is provided between the connection wires 14 and first touch wires 111 in a different film from the connection wires 14, and along the thickness direction of the display panel, a first touch wire 111 in a different film from a connection wire 14 is configured to at least partially overlap the connection wire 14 so that a first via 131 may be disposed in the first insulating layer 13. In this manner, the first touch wire 111 in the different film from the connection wire 14 is electrically connected to the connection wire 14 through the first via 131.

With continued reference to FIGS. 1 to 4, optionally, the first touch wires 111 include a first touch subwire 111A and a second touch subwire 111B which are disposed in different films, the multiple connection wires 14 include a first connection wire 14A and a second connection wire 14B, and the multiple bonding pads 12 include a first bonding pad 12A and a second bonding pad 12B. The first touch subwire 111A includes a first wire portion 31 and a second wire portion 32, the second wire portion 32 is electrically connected to the first wire portion 31 and the first connection wire 14A separately, and the first connection wire 14A is electrically connected to the first bonding pad 12A. The second touch subwire 111B is electrically connected to the second connection wire 14B, and the second connection wire 14B is electrically connected to the second bonding pad 12B. An extension direction of the first wire portion 31 is parallel to an extension direction of the second touch subwire 111B, and along the thickness direction of the display panel, the first wire portion 31 and the second touch subwire 111B at least partially overlap. The extension direction of the first wire portion 31 intersects an extension direction of the second wire portion 32.

Specifically, as shown in FIGS. 1 to 4, among the multiple first touch wires 111, at least two first touch wires 111 disposed in different films overlap along the thickness direction of the display panel, and two overlapping first touch wires 111 may be called the first touch subwire 111A and the second touch subwire 111B separately. The first touch subwire 111A is electrically connected to the first bonding pad 12A through the first connection wire 14A, and the second touch subwire 111B is electrically connected to the second bonding pad 12B through the second connection wire 14B.

The first touch subwire 111A includes the first wire portion 31, the first wire portion 31 is at least partially disposed in the display region 20, the extension direction of the first wire portion 31 is the same as the extension direction of the second touch subwire 111B (as shown in FIG. 2, the first wire portion 31 and the second touch subwire 111B both extend along a column direction), and along the thickness direction of the display panel, the first wire portion 31 and the second touch subwire 111B at least partially overlap so that the distribution area of the first touch subwire 111A and the second touch subwire 111B along the thickness direction of the display panel is reduced in the display region 20, which is beneficial for reducing an impact of the first touch subwire 111A and the second touch subwire 111B on the display effect of the display region 20.

Further, for ease of bonding, the multiple bonding pads 12 are at different positions. For example, as shown in FIGS. 1 and 2, the multiple bonding pads 12 are arranged along a first direction X, where the first direction X intersects the extension direction of the second touch subwire 111B. Accordingly, the multiple connection wires 14 correspondingly connected to the multiple bonding pads 12 are also at different positions. For example, an arrangement direction of the multiple connection wires 14 is the same as an arrangement direction of the multiple bonding pads 12, and an extension direction of the connection wires 14 is parallel to the extension direction of the second touch subwire 111B.

In the present embodiment, the second touch subwire 111B may extend along the same direction integrally and be directly connected to the second connection wire 14B.

The first touch subwire 111A also includes the second wire portion 32 connected to the first wire portion 31, and the first wire portion 31 is electrically connected to the first connection wire 14A through the second wire portion 32.

The extension direction of the second wire portion 32 intersects the extension direction of the first wire portion 31, that is, the extension direction of the second wire portion 32 intersects the extension direction of the second touch subwire 111B so that the second wire portion 32 and the second touch subwire 111B no longer overlap along the thickness direction of the display panel. In this manner, the second wire portion 32 is led to the first connection wire 14A at a different position from the second connection wire 14B so that the first touch subwire 111A and the first connection wire 14A are electrically connected, and the first touch subwire 111A and the second touch subwire 111B are led to different bonding pads 12 (for example, the first bonding pad 12A and the second bonding pad 12B), thereby separately bonding and connecting the first touch subwire 111A and the second touch subwire 111B to different pins of the touch chip.

Figure 6:
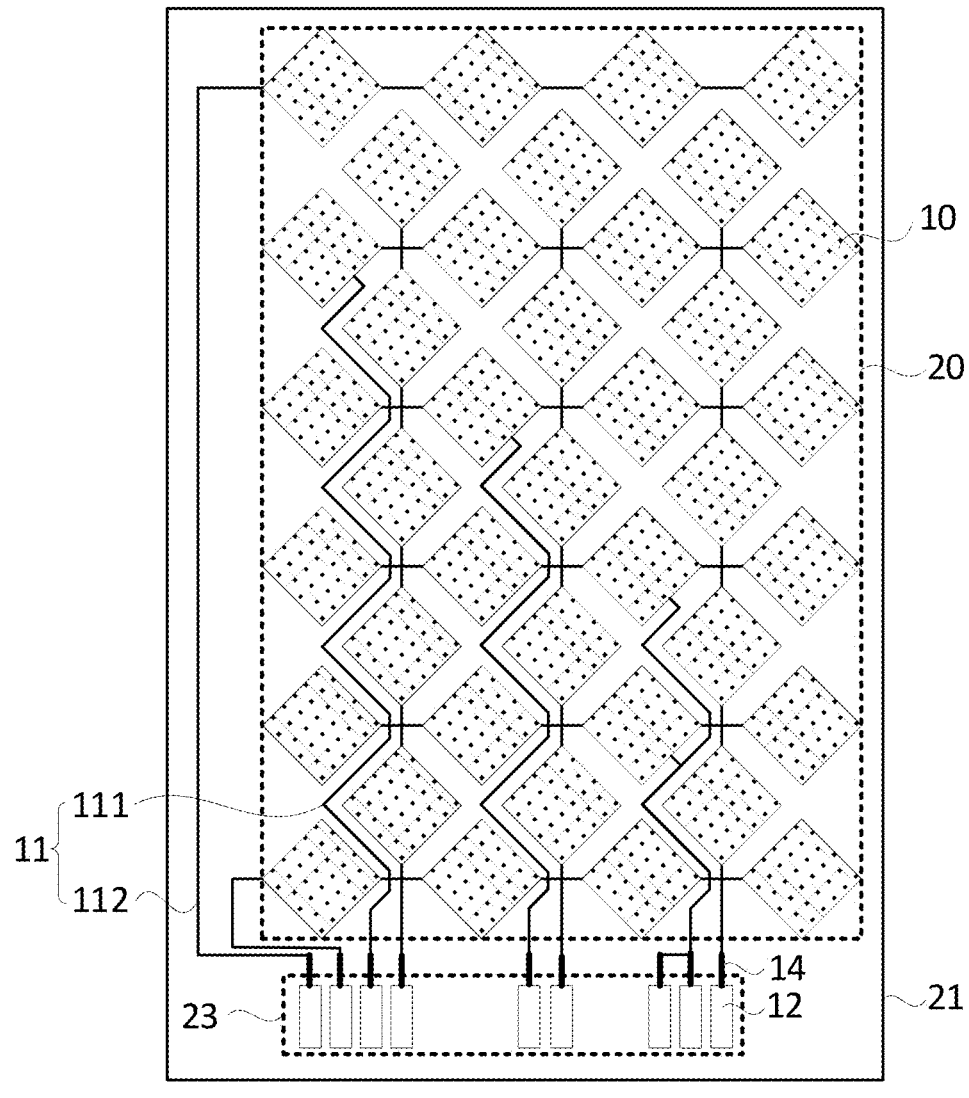
FIG. 6 is a structure diagram of another display panel according to an embodiment of the present disclosure.

FIG. 6 is a structure diagram of another display panel according to an embodiment of the present disclosure. As shown in FIGS. 1 to 6, optionally, the multiple touch wires 11 also include multiple second touch wires 112, which are disposed in the non-display region 21.

With the requirement for higher touch accuracy, the number of touch electrode blocks 10 increases, and the number of touch wires 11 also increases. However, the display region 20 provided with dense sub-pixels cannot provide too much space for accommodating all the touch wires 11.

Therefore, as shown in FIGS. 1 to 6, in the present embodiment, at least one touch wire 11 (that is, a second touch wire 112) is disposed in the non-display region 21 so that the number of touch wires 11 (that is, first touch wires 111) disposed in the display region 20 is not too large, thereby reducing the impact of the first touch wires 111 on the display effect of the display region 20.

Optionally, the ratio of the number of first touch wires 111 to the number of touch wires 11 is k, where $1/3 \le k \le 1/2$.

The ratio k of the number of first touch wires 111 to the number of touch wires 11 is configured to satisfy that $1/3 \le k \le 1/2$. On the one hand, the number of first touch wires 111 disposed in the display region 20 is not too large, thereby preventing the first touch wires 111 from significantly affecting the display effect of the display region 20. On the other hand, the number of second touch wires 112 disposed in the non-display region 21 is not too large, thereby reducing the width of the non-display region 21, increasing the screen-to-body ratio, and helping to meet the requirement for the narrow bezel.

In other embodiments, the number of first touch wires 111 and the number of second touch wires 112 among the touch wires 11 may be set according to actual requirements, which are not specifically limited in the embodiment of the present disclosure.

Figures 7, 8:
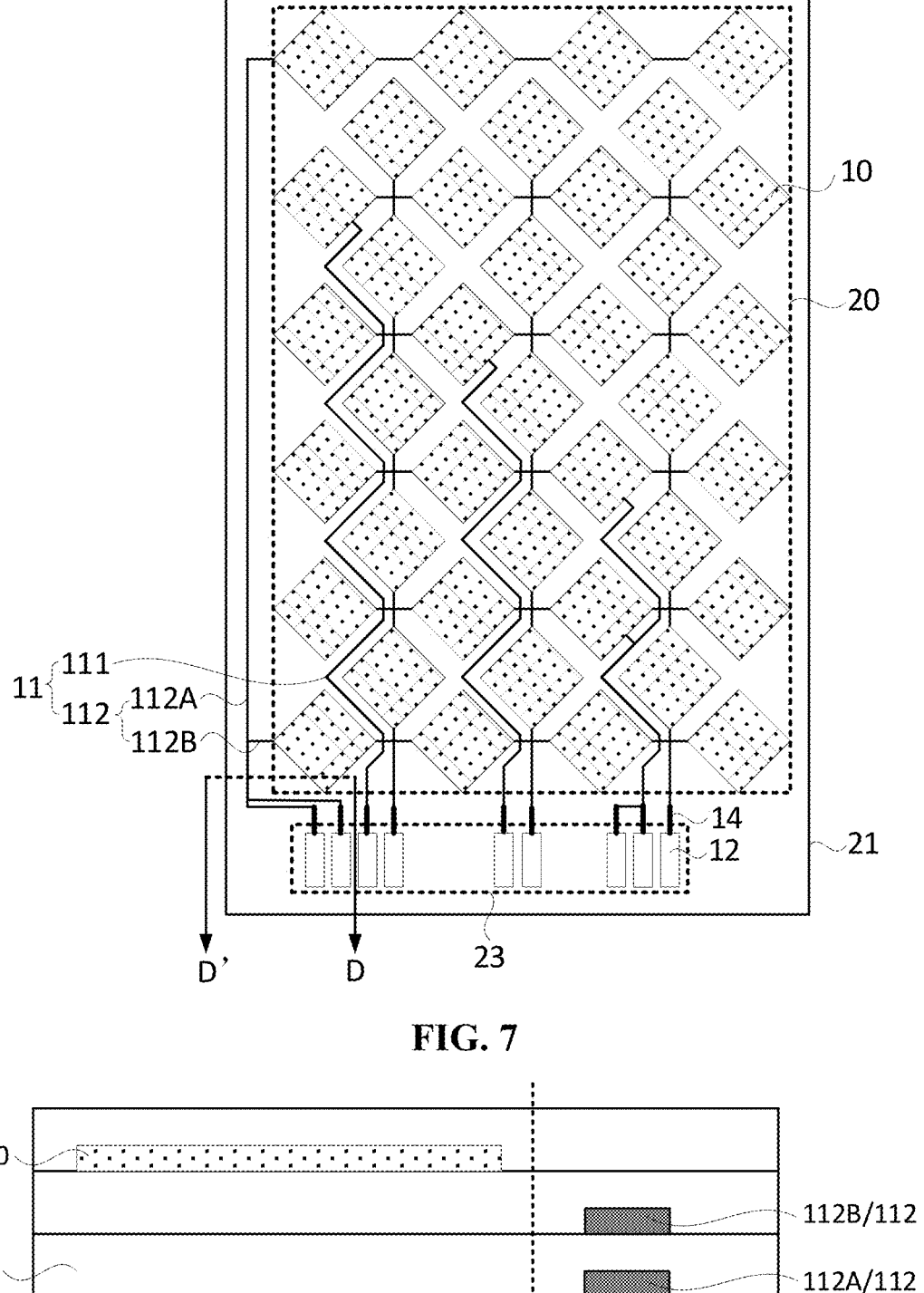
FIG. 7 is a structure diagram of another display panel according to an embodiment of the present disclosure.
FIG. 8 is a sectional view of FIG. 7 taken along a line D-D'.

FIG. 7 is a structure diagram of another display panel according to an embodiment of the present disclosure. FIG. 8 is a sectional view of FIG. 7 taken along a line D-D'. As shown in FIGS. 7 and 8, the multiple second touch wires 112 include a third touch subwire 112A and a fourth touch subwire 112B, where the third touch subwire 112A and the fourth touch subwire 112B are disposed in different films, and along the thickness direction of the display panel, the third touch subwire 112A and the fourth touch subwire 112B at least partially overlap.

Specifically, as shown in FIGS. 7 and 8, the multiple second touch wires 112 include at least two second touch wires 112 (for example, the third touch subwire 112A and the fourth touch subwire 112B) disposed in different films, that is, the second touch wires 112 are changed from planar wiring in a single film to layered wiring. The at least two second touch wires 112 (for example, the third touch subwire 112A and the fourth touch subwire 112B) disposed in different films overlap along the thickness direction of the display panel so as to reduce the occupied space of the second touch wires 112 in the non-display region 21, thereby reducing the width of the non-display region 21, increasing the screen-to-body ratio, and helping to meet the requirement for the narrow bezel.

It is to be noted that all the second touch wires 112 may be arranged in two films, or may be arranged in more films. For example, the number of films for arranging the second touch wires 112 may be the same as the number of second touch wires 112, that is, each second touch wire 112 is separately set in one film, and any two second touch wires 112 are disposed in different films, but it is not limited thereto.

It is to be understood that the smaller the number of films for arranging the second touch wires 112, the better the thickness of the display panel is reduced, which is beneficial for designing a light and thin the display panel; the larger the number of the films for arranging the second touch wires 112, the smaller the number of second touch wires 111 in each film, and the better the occupied planar space of the second touch wires 112 in the non-display region 21 is reduced so that the width of the non-display region 21 is reduced, and the screen-to-body ratio is increased. The number of the films for arranging the second touch wires 112 is not limited in the embodiment of the present disclosure.

With continued reference to FIGS. 7 and 8, along the thickness direction of the display panel, the first insulating layer 13 is disposed between second touch wires 112 (for example, the third touch subwire 112A and the fourth touch subwire 112B) in adjacent films, where the first insulating layer 13 is used for ensuring that metal layers in the adjacent films are insulated, so as to avoid signal crosstalk.

The thickness of the first insulating layer 13 may be twice or more than twice the thickness of the second touch wire 112, so as to ensure that the first insulating layer 13 can completely cover the second touch wire 112 and prevent the second touch wire 112 from being exposed to cause a short circuit between the second touch wires 112 in the adjacent films.

Figure 9:
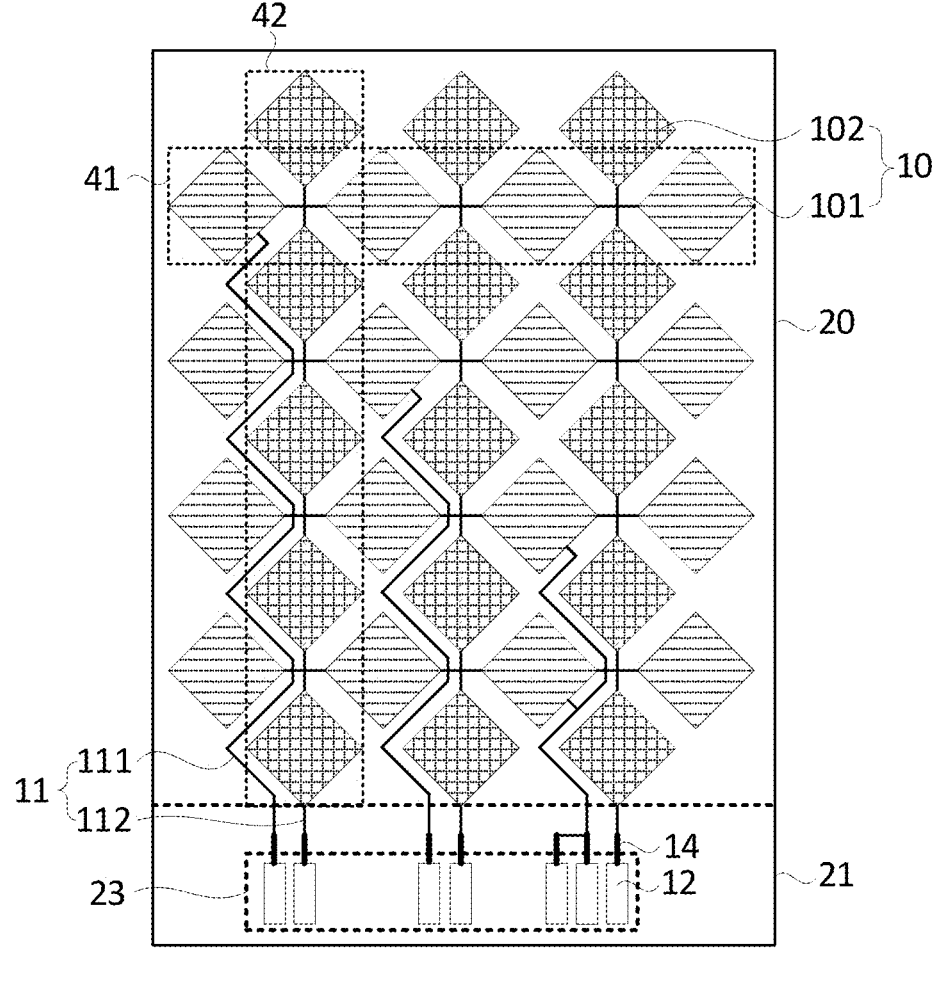
FIG. 9 is a structure diagram of another display panel according to an embodiment of the present disclosure.

FIG. 9 is a structure diagram of another display panel according to an embodiment of the present disclosure. As shown in FIG. 9, the multiple touch electrode blocks 10 include multiple first touch electrode blocks 101 arranged in an array and multiple second touch electrode blocks 102 arranged in an array, where the first touch electrode blocks

101 and the second touch electrode blocks 102 are spaced apart. Along a row direction, adjacent two first touch electrode blocks 101 are electrically connected to each other to form multiple first touch electrodes 41, and the multiple first touch electrodes 41 extend along the row direction and are arranged along the column direction. Along the column direction, adjacent two second touch electrode blocks 102 are electrically connected to each other to form multiple second touch electrodes 42, and the multiple second touch electrodes 42 extend along the column direction and are arranged along the row direction.

Specifically, as shown in FIG. 9, multiple first touch electrode blocks 101 arranged along the row direction are electrically connected in sequence to form a first touch electrode 41. Multiple second touch electrode blocks 102 arranged along the column direction are electrically connected in sequence to form a second touch electrode 42. The first touch electrode 41 and the second touch electrode 42 are insulated from each other, constituting a mutual capacitive touch structure. The display panel may generate touch information based on a capacitance change between the first touch electrode 41 and the second touch electrode 42, thereby implementing the touch function.

Optionally, the first touch electrode 41 is a touch driving electrode, and the second touch electrode 42 is a touch sensing electrode; alternatively, the first touch electrode 41 is a touch sensing electrode, and the second touch electrode 42 is a touch driving electrode.

The touch driving electrode and the touch sensing electrode are both electrically connected to the touch chip. In a touch stage of the display panel, the touch chip sends a touch driving signal to the touch driving electrode. When the touch sensing electrode senses a touch from a finger or another touch object, the touch sensing electrode sends a touch sensing signal to the touch chip. The touch chip processes the touch sensing signal to obtain a touch position, thereby implementing the touch function of the display panel.

It is to be noted that in any one of the preceding embodiments, the multiple touch electrode blocks 10 may all adopt the mutual capacitive touch structure, and the details are not repeated here.

With continued reference to FIG. 9, optionally, the non-display region 21 includes the bonding region 23 disposed on a side of the display region 20, the display region 20 and the bonding region 23 are arranged along the column direction, and a first touch electrode 14 of the first touch electrodes 41 is electrically connected to a first touch wire 111 of the first touch wires 111 correspondingly. The multiple touch wires 11 also include the multiple second touch wires 112, where the second touch wires 112 are disposed in the non-display region 21, and a second touch electrode 42 of the second touch electrodes 42 is electrically connected to a second touch wire 112 of the second touch wires 112 correspondingly.

Specifically, as shown in FIG. 9, the bonding region 23 is disposed on a side of the display region 20, the bonding region 23 is provided with the multiple bonding pads 12, and the multiple bonding pads 12 are bonded to the touch chip so that electrical connections are formed between the bonding pads 12 and the touch chip.

The first touch wires 111 connected to the first touch electrodes 41 and the second touch wires 112 connected to the second touch electrodes 42 need to be led into the bonding region 23 and connected to the bonding pads 12 so that the first touch electrodes 41 and the second touch electrodes 42 are electrically connected to the touch chip separately. The touch chip performs signal transmission with the first touch electrodes 41 through the first touch wires 111 and performs signal transmission with the second touch electrodes 42 through the second touch wires 112, thereby implementing the touch function.

At least part of the first touch wire 111 connected to the first touch electrode 41 extending along the row direction is configured to be disposed in the display region 20 so that the touch wires 11 (that is, the first touch wires 111) connected to the first touch electrodes 41 are led into the bonding region 23 through the display region 20, thereby reducing the wiring area of the touch wires 11 in the non-display region 21, reducing the width of the non-display region 21, increasing the screen-to-body ratio, and helping to meet the requirement for the narrow bezel.

Meanwhile, the second touch wires 112 connected to the second touch electrodes 42 extending along the column direction are configured to be disposed in the non-display region 21 so that the touch wires 11 (that is, the second touch wires 112) connected to the second touch electrodes 42 are led into the bonding region 23 through the non-display region 21. On the one hand, the number of touch wires 11 (that is, the first touch wires 111) disposed in the display region 20 is not too large, thereby reducing the impact of the first touch wires 111 on the display effect of the display region 20. On the other hand, as shown in FIG. 9, the second touch wire 112 may be electrically connected to an end of the second touch electrode 42 adjacent to the bonding region 23 correspondingly so that the length of the second touch wire 112 may be relatively short, thereby helping to reduce a transmission loss of a signal transmitted by the second touch wire 112 on the second touch electrode 42.

Figure 10:
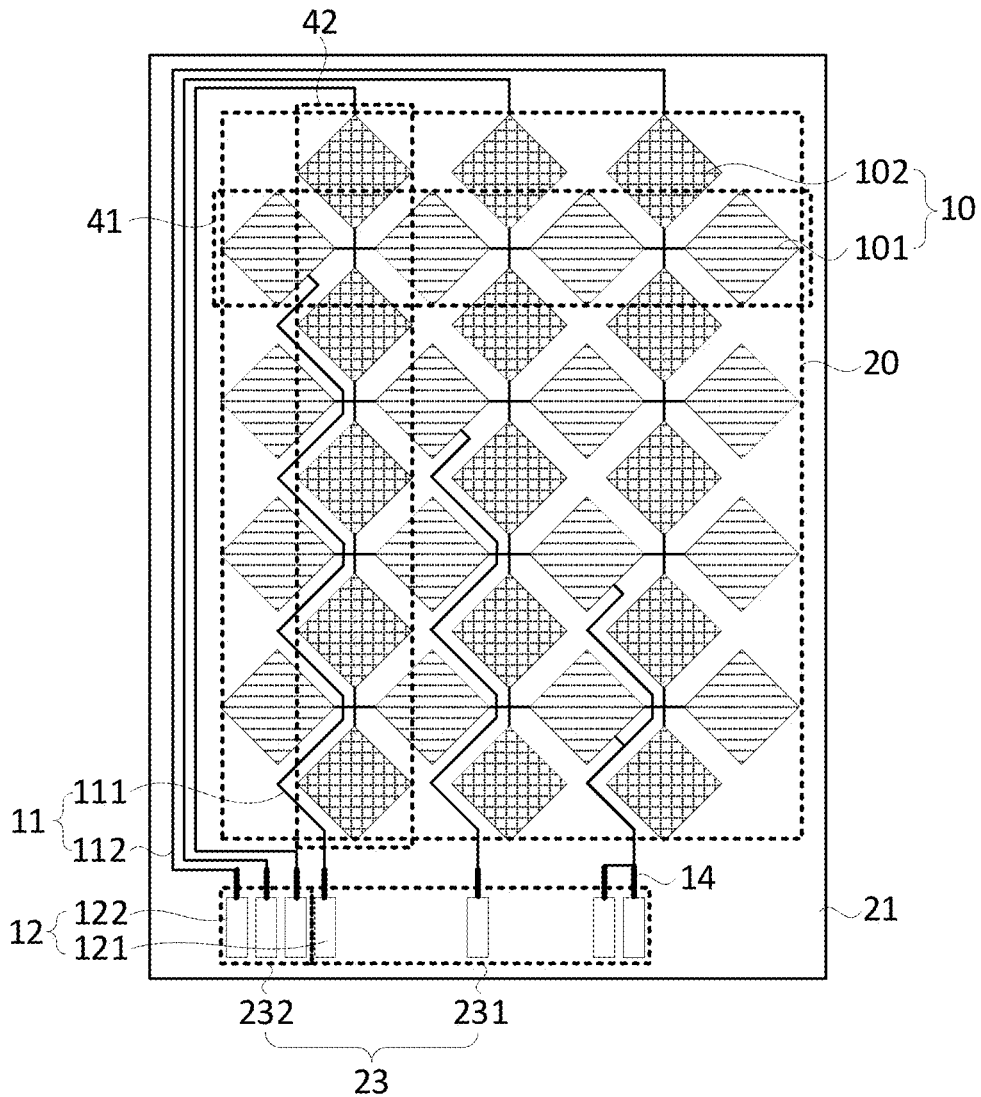
FIG. 10 is a structure diagram of another display panel according to an embodiment of the present disclosure.

FIG. 10 is a structure diagram of another display panel according to an embodiment of the present disclosure. As shown in FIG. 10, optionally, the bonding region 23 includes the multiple bonding pads 12, the multiple bonding pads 12 include a third bonding pad 121 and a fourth bonding pad 122, the bonding region 23 includes a first bonding region 231 and a second bonding region 232, where the second bonding region 232 is disposed on at least one side of the first bonding region 231 along the row direction. The third bonding pad 121 is disposed in the first bonding region 231, the fourth bonding pad 122 is disposed in the second bonding region 232, one end of the second touch wire 112 is electrically connected to an end of the second touch electrode 42 facing away from the bonding region 23 correspondingly, and the other end of the second touch wire 112 is electrically connected to the fourth bonding pad 122 correspondingly, and the first touch wire 111 is electrically connected to the third bonding pad 121 correspondingly.

It is to be noted that as described above, the first touch electrode 41 is the touch driving electrode for transmitting the touch driving signal, and the second touch electrode 42 is the touch sensing electrode for transmitting the touch sensing signal; alternatively, the first touch electrode 41 is the touch sensing electrode for transmitting the touch sensing signal, and the second touch electrode 42 is the touch driving electrode for transmitting the touch driving signal. That is, if different types of touch signals are transmitted on the first touch electrode 41 and the second touch electrode 42, different types of touch signals are transmitted on the first touch wire 111 connected to the first touch electrode 41 and the second touch wire 112 connected to the second touch electrode 42.

With continued reference to FIG. 9, the inventors have found that if the second touch wire 112 is electrically connected to an end of the second touch electrode 42 adjacent to the bonding region 23 correspondingly, the multiple first touch wires 111 and the multiple second touch wires 112 are alternately arranged along the row direction in the non-display region 21, and thus touch signals transmitted on the first touch wires 111 and touch signals transmitted on the second touch wires 112 easily interfere with each other, thereby affecting touch accuracy.

Based on the preceding technical problem, as shown in FIG. 10, in the present embodiment, the bonding region 23 is divided into the first bonding region 231 and the second bonding region 232, and the second bonding region 232 is disposed on at least one side of the first bonding region 231 along the row direction. Third bonding pads 121 of the multiple bonding pads 12 are all disposed in the first bonding region 231, and fourth bonding pads 122 of the multiple bonding pads 12 are all disposed in the second bonding region 232 so that the third bonding pads 121 and the fourth bonding pads 122 are arranged in different regions.

Further, the first touch wire 111 connected to the first touch electrode 41 is led into the first bonding region 231 through the display region 20 to be electrically connected to the third bonding pad 121 correspondingly. The second touch wire 112 connected to the end of the second touch electrode 42 facing away from the bonding region 23 is led into the second bonding region 232 through the non-display region 21 to be electrically connected to the fourth bonding pad 122 correspondingly. In this manner, the first touch wires 111 and the second touch wires 112 may be separately wired. Meanwhile, the third bonding pads 121 electrically connected to the first touch wires 111 and the fourth bonding pads 122 electrically connected to the second touch wires 112 are separately disposed in different regions so that signal interference between the first touch wires 111 and the second touch wires 112 can be reduced, thereby helping to improve touch accuracy.

In some embodiments, the display panel also includes a shield wire disposed between the first touch wire 111 and the second touch wire 112 adjacent to the first touch wire 111, thereby avoiding signal interference between the first touch wire 111 and the second touch wire 112. Optionally, the shield wire is connected to a fixed potential.

Figure 11:
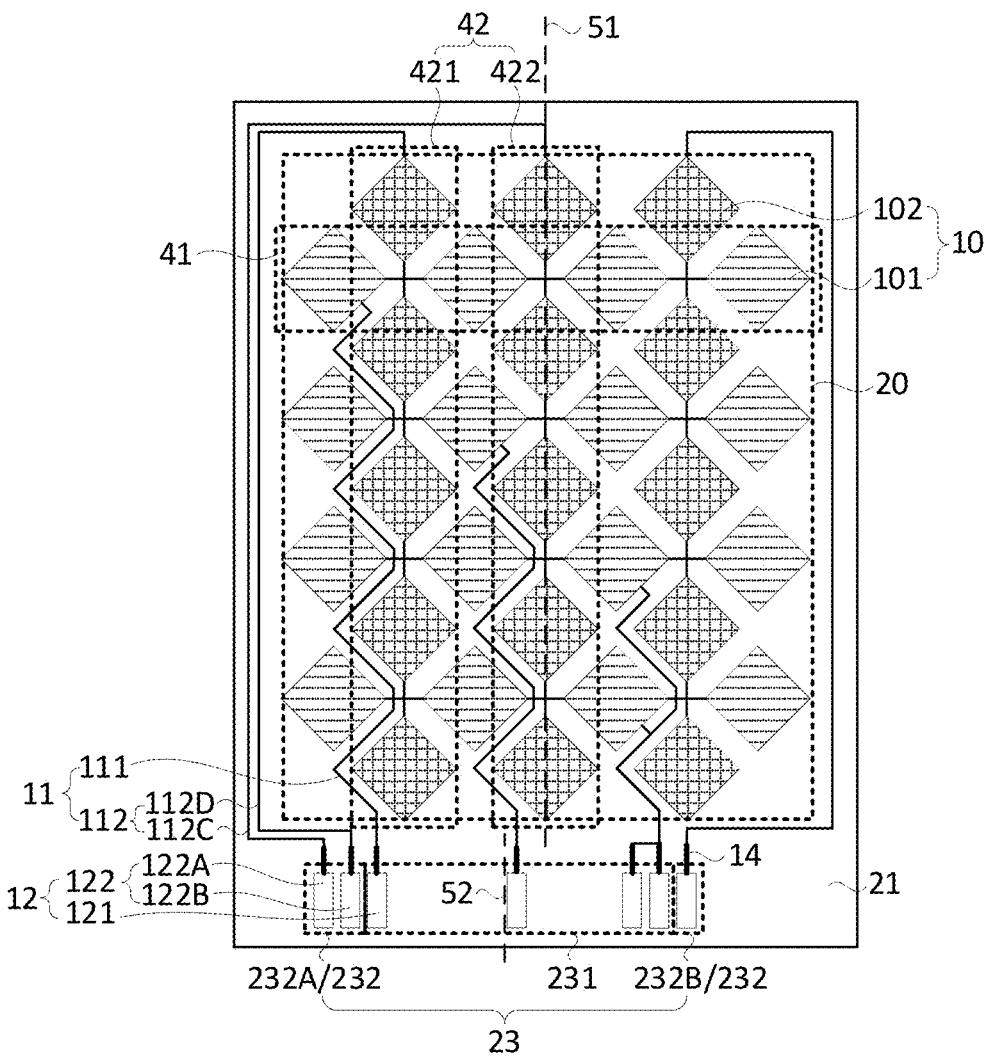
FIG. 11 is a structure diagram of another display panel according to an embodiment of the present disclosure.

FIG. 11 is a structure diagram of another display panel according to an embodiment of the present disclosure. As shown in FIG. 11, the second bonding region 232 includes a first bonding subregion 232A and a second bonding subregion 232B. Along the row direction, the first bonding subregion 232A and the second bonding subregion 232B are disposed on two opposite sides of the first bonding region 231, separately.

Specifically, as shown in FIG. 11, the second bonding region 232 is divided into two bonding subregions, which are the first bonding subregion 232A and the second bonding subregion 232B separately. Along the row direction, the first bonding subregion 232A and the second bonding subregion 232B are disposed on two opposite sides of the first bonding region 231, separately. As shown in FIG. 11, using an example where the first bonding subregion 232A is disposed on the left side of the first bonding region 231 and the second bonding subregion 232B is disposed on the right side of the first bonding region 231, part of the second touch wires 112 is led into the first bonding subregion 232A through the non-display region 21 on the left side of the display region 20 to be electrically connected to fourth bonding pads 122 in the first bonding subregion 232A correspondingly; the other part of the second touch wires 112 are led into the second bonding subregion 232B through the non-display region 21 on the right side of the display region 20 to be electrically connected to fourth bonding pads 122 in the second bonding subregion 232B correspondingly.

In comparison with the display panel shown in FIG. 10, the second bonding region 232 is divided into two bonding subregions, and along the row direction, the two bonding subregions are disposed on two opposite sides of the first bonding region 231, separately. In this manner, the multiple second touch wires 112 can be dispersed in the non-display region 21 on two sides of the display region 20 so that the number of second touch wires 112 in the non-display region 21 on a single side can be reduced, thereby helping to reduce the width of a bezel on a single side and meeting the requirement for the narrow bezel.

It is to be noted that in other embodiments, as shown in FIG. 10, the second bonding region 232 may be disposed on only one side of the first bonding region 231 along the row direction, which is not specifically limited in the embodiment of the present disclosure.

With continued reference to FIG. 11, optionally, the second touch electrodes 42 include a first touch subelectrode 421 and a second touch subelectrode 422, and along the row direction, the first touch subelectrode 421 is disposed on a side of the second touch subelectrode 422 facing away from a first central axis 51. The fourth bonding pad 122 includes a first bonding subpad 122A and a second bonding subpad 122B, and along the row direction, the first bonding subpad 122A is disposed on a side of the second bonding subpad 122B facing away from a second central axis 52. The first central axis 51 is a central axis of the display region 20, and an extension direction of the first central axis 51 is parallel to the column direction. The second central axis 52 is a central axis of the bonding region 23, and an extension direction of the second central axis 52 is parallel to the column direction. The second touch wires 112 include a fifth touch subwire 112C and a sixth touch subwire 112D, where the fifth touch subwire 112C is disposed on a side of the sixth touch subwire 112D facing away from the display region 20. The fifth touch subwire 112C is electrically connected to the second touch subelectrode 422 and the first bonding subpad 122A separately, and the sixth touch subwire 112D is electrically connected to the first touch subelectrode 421 and the second bonding subpad 122B separately.

Specifically, as shown in FIG. 11, along the row direction, the closer the second touch electrode 42 (for example, the second touch subelectrode 422) is to the first central axis 51 of the display region 20, the farther the second touch wire 112 (for example, the fifth touch subwire 112C) connected to the second touch electrode 42 (for example, the second touch subelectrode 422) is from the first central axis 51, and the farther the fourth bonding pad 122 (for example, the first bonding subpad 122A) electrically connected to the second touch electrode 42 (for example, the second touch subelectrode 422) is from the second central axis 52 of the bonding region 23.

Similarly, along the row direction, the farther the second touch electrode 42 (for example, the first touch subelectrode 421) is from the first central axis 51 of the display region 20, the closer the second touch wire 112 (for example, the sixth touch subwire 112D) connected to the second touch electrode 42 (for example, the first touch subelectrode 421) is to the first central axis 51, and the closer the fourth bonding pad 122 (for example, the second bonding subpad 122B) electrically connected to the second touch electrode 42 (for example, the first touch subelectrode 421) is to the second central axis 52 of the bonding region 23. In this manner, the multiple second touch wires 112 (for example, the fifth touch subwire 112C and the sixth touch subwire 112D) can be prevented from intersecting, that is, the multiple second touch wires 112 (for example, the fifth touch subwire 112C and the sixth touch subwire 112D) are prevented from overlapping along the thickness direction of the display panel so that signal interference between the multiple second touch wires 112 (for example, the fifth touch subwire 112C and the sixth touch subwire 112D) can be reduced, thereby helping to improve the touch accuracy.

With continued reference to FIGS. 1 to 4 and 6 to 11, optionally, along the thickness direction of the display panel, the first touch wire 111 is disposed in a gap between two adjacent touch electrode blocks 10.

As shown in FIGS. 1 to 4 and 6 to 11, the first touch wire 111 is disposed in the gap between two adjacent touch electrode blocks 10 so that the first touch wires 111 and the touch electrode blocks 10 can be prevented from overlapping along the thickness direction of the display panel, thereby avoiding parasitic capacitance between the first touch wires 111 and the touch electrode blocks 10, preventing and reducing an impact of the parasitic capacitance on touch signals transmitted on the first touch wires 111 and the touch electrode blocks 10, and helping to improve the touch accuracy.

With continued reference to FIG. 2, optionally, a shortest distance between adjacent touch electrode blocks 10 is d1, and a maximum width of the first touch wires 111 is d, where $d1 \geq 2*d$.

The shortest distance d1 between adjacent touch electrode blocks 10 is configured to be twice or more than twice the maximum width d of the first touch wires 111 so that sufficient arrangement space can be provided for the first touch wires 111, thereby preventing the first touch wires 111 and the touch electrode blocks 10 from overlapping along the thickness direction of the display panel due to a process error, avoiding the impact of the parasitic capacitance between the first touch wires 111 and the touch electrode blocks 10 on the touch signals transmitted on the first touch wires 111 and the touch electrode blocks 10, and helping to improve the touch accuracy.

Figure 12:
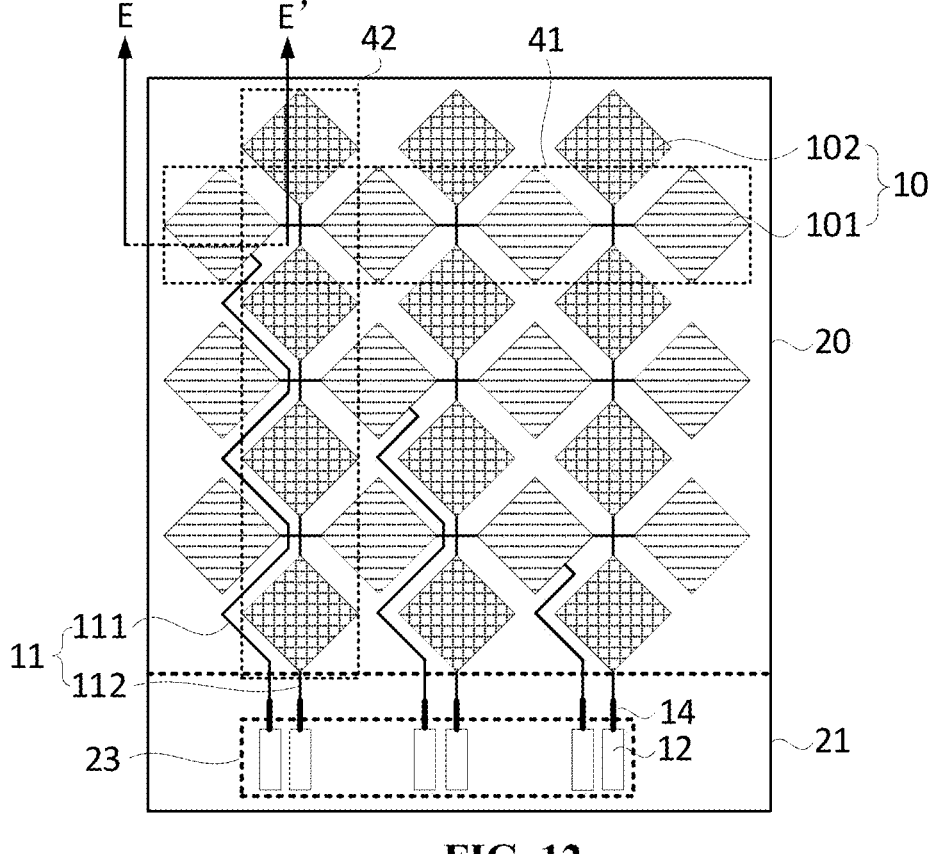
FIG. 12 is a structure diagram of another display panel according to an embodiment of the present disclosure.
Figure 13:
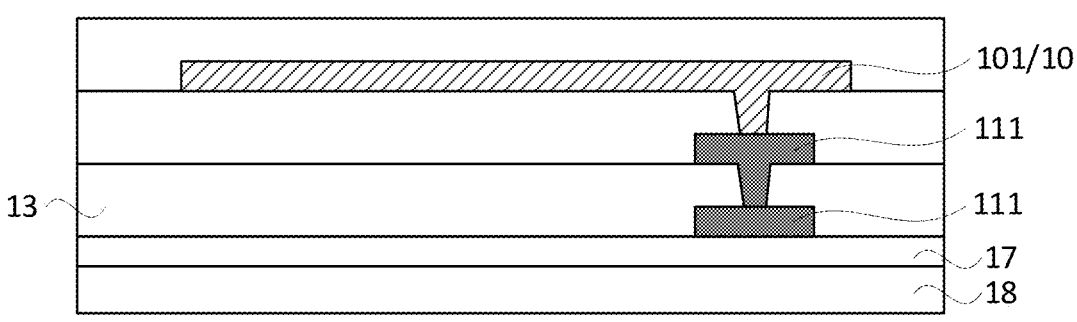
FIG. 13 is a sectional view of FIG. 12 taken along a line E-E'.

FIG. 12 is a structure diagram of another display panel according to an embodiment of the present disclosure. FIG. 13 is a sectional view of FIG. 12 taken along a line E-E'. As shown in FIGS. 12 and 13, optionally, the non-display region 21 includes the bonding region 23 disposed on a side of the display region 20, the display region 20 and the bonding region 23 are arranged along the column direction, the first touch electrodes 41 are electrically connected to the first touch wires 111 correspondingly, and the first touch wires 111 electrically connected to the first touch electrodes 41 extend along the column direction. The number of first touch electrodes 41 is M, and the number of second touch electrodes 42 is N, where M=N. A first touch wire 111 electrically connected to a first touch electrode 41 in the n-th row is disposed between first touch electrode blocks 101 in the n-th column and a second touch electrode 42 in the n-th column, where $1 \leq n \leq M$, and n is a positive integer.

Specifically, as shown in FIGS. 12 and 13, when the number of first touch electrodes 41 is the same as the number of second touch electrodes 42, the first touch wire 111 electrically connected to the first touch electrode 41 in the n-th row may be configured to be disposed between the first touch electrode blocks 101 in the n-th column and the second touch electrode 42 in the n-th column. For example, as shown in FIG. 12, using an example where M=N=3, a first touch wire 111 electrically connected to a first touch electrode 41 in the first row is disposed between first touch electrode blocks 101 in the first column and a second touch electrode 42 in the first column; a first touch wire 111 electrically connected to a first touch electrode 41 in the second row is disposed between first touch electrode blocks 101 in the second column and a second touch electrode 42 in the second column; and a first touch wire 111 electrically connected to a first touch electrode 41 in the third row is disposed between first touch electrode blocks 101 in the third column and a second touch electrode 42 in the third column.

In this manner, the first touch wires 111 can be uniformly distributed in gaps between the multiple touch electrode blocks 10 along the row direction, thereby helping to improve the display uniformity of the display region 20.

Figure 14:
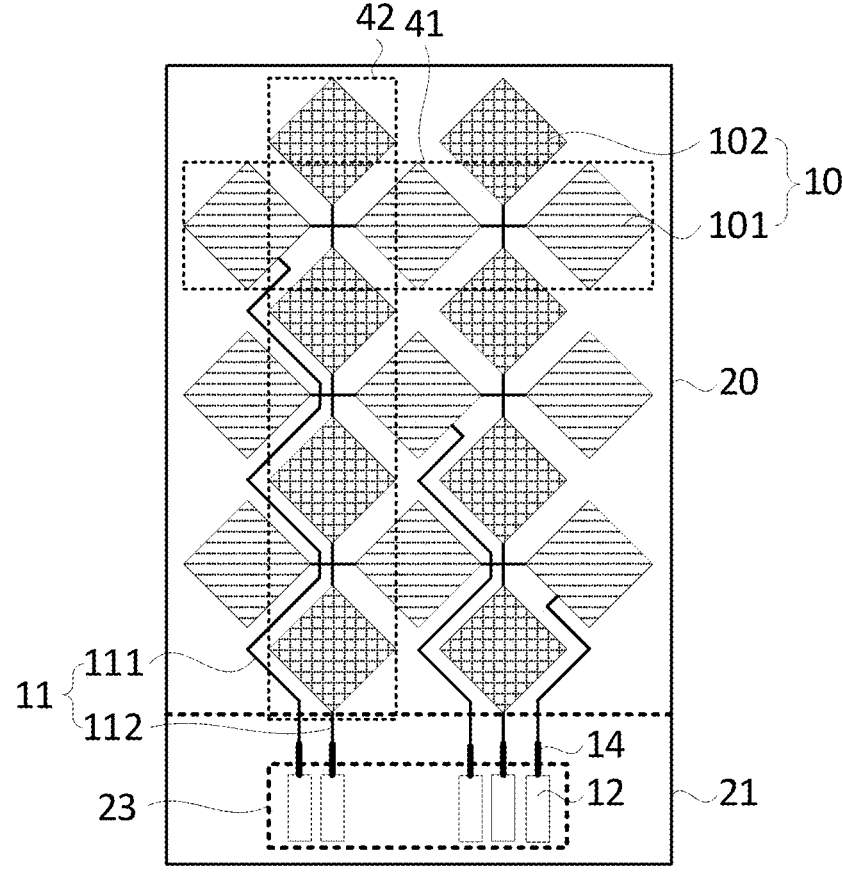
FIG. 14 is a structure diagram of another display panel according to an embodiment of the present disclosure.

FIG. 14 is a structure diagram of another display panel according to an embodiment of the present disclosure. As shown in FIG. 14, optionally, the non-display region 21 includes the bonding region 23 disposed on a side of the display region 20, the display region 20 and the bonding region 23 are arranged along the column direction, the first touch electrodes 41 are electrically connected to the first touch wires 111 correspondingly, and the first touch wires 111 electrically connected to the first touch electrodes 41 extend along the column direction. The number of first touch electrodes 41 is M, and the number of second touch electrodes 42 is N, where M≠N. At least one first touch wire 111 electrically connected to a first touch electrode 41 is disposed between first touch electrode blocks 101 in the n-th column and a second touch electrode 42 in the (n-1)-th column, where 1<n≤N, and n is a positive integer.

Specifically, as shown in FIG. 14, when the number of first touch electrodes 41 is different from the number of second touch electrodes 42, the at least one first touch wire 111 electrically connected to the first touch electrode 41 may be configured to be disposed between the first touch electrode blocks 101 in the n-th column and the second touch electrode 42 in the (n-1)-th column.

As shown in FIG. 14, when the number M of first touch electrodes 41 is greater than the number N of second touch electrodes 42, the number of first touch wires 111 electrically connected to the first touch electrodes 41 is relatively large, and the space of a gap between the first touch electrode blocks 101 in the n-th column and the second touch electrode 42 in the n-th column is insufficient to arrange the first touch wire 111. In this case, at least one first touch wire 111 is disposed in a gap between the first touch electrode blocks 101 in the n-th column and the second touch electrode 42 in the (n-1)-th column so that the requirement for arranging the first touch wires 111 in the display region 20 is satisfied.

For example, as shown in FIG. 14, using an example where M=3 and N=2, the first touch wire 111 electrically connected to the first touch electrode 41 in the first row is disposed between the first touch electrode blocks 101 in the first column and the second touch electrode 42 in the first column; the first touch wire 111 electrically connected to the first touch electrode 41 in the second row is disposed between the first touch electrode blocks 101 in the second column and the second touch electrode 42 in the second column; and the first touch wire 111 electrically connected to the first touch electrode 41 in the third row is disposed between the first touch electrode blocks 101 in the third column and the second touch electrode 42 in the second column, but it is not limited thereto.

In other embodiments, if the number M of first touch electrodes 41 is smaller than the number N of second touch electrodes 42, the first touch wire 111 may be disposed in the space of the gap between the first touch electrode blocks 101 in the n-th column and the second touch electrode 42 in the (n-1)-th column so that the flexibility of arrangement of the first touch wires 111 can be improved, and the uniformity of distribution of the multiple first touch wires 111 along the row direction can be better improved, thereby helping to improve the display uniformity of the display region 20.

With continued reference to FIG. 12, optionally, any two adjacent first touch wires 111 have the same interval along the row direction.

The interval between two adjacent first touch wires 111 along the row direction is configured to be a fixed value so that the first touch wires 111 are uniformly distributed in the display region 20 along the row direction, thereby helping to improve the display uniformity of the display region 20.

With continued reference to FIGS. 12 and 13, optionally, at least one first touch electrode 41 is connected to at least two first touch wires 111.

Specifically, as shown in FIGS. 12 and 13, the first touch electrode 41 is configured to transmit a touch signal through at least two first touch wires 111 connected in parallel so that the resistivity of the first touch wires 111 connected to the first touch electrode 41 can be reduced, and a voltage drop of the touch signal on the first touch wires 111 connected to the first touch electrode 41 can be reduced, thereby helping to improve the touch accuracy.

With continued reference to FIGS. 12 and 13, optionally, along the thickness direction of the display panel, the at least two first touch wires 111 connected to the first touch electrode 41 at least partially overlap.

For example, as shown in FIGS. 12 and 13, using an example where one first touch electrode 41 is connected to two first touch wires 111, the two first touch wires 111 connected to the first touch electrode 41 overlap along the thickness direction of the display panel, thereby reducing the distribution area of the two first touch wires 111 connected to the first touch electrode 41 in the display region 20 and helping to reduce an impact of the two first touch wires 111 connected to the first touch electrode 41 on the display effect of the display region 20.

Figure 15:
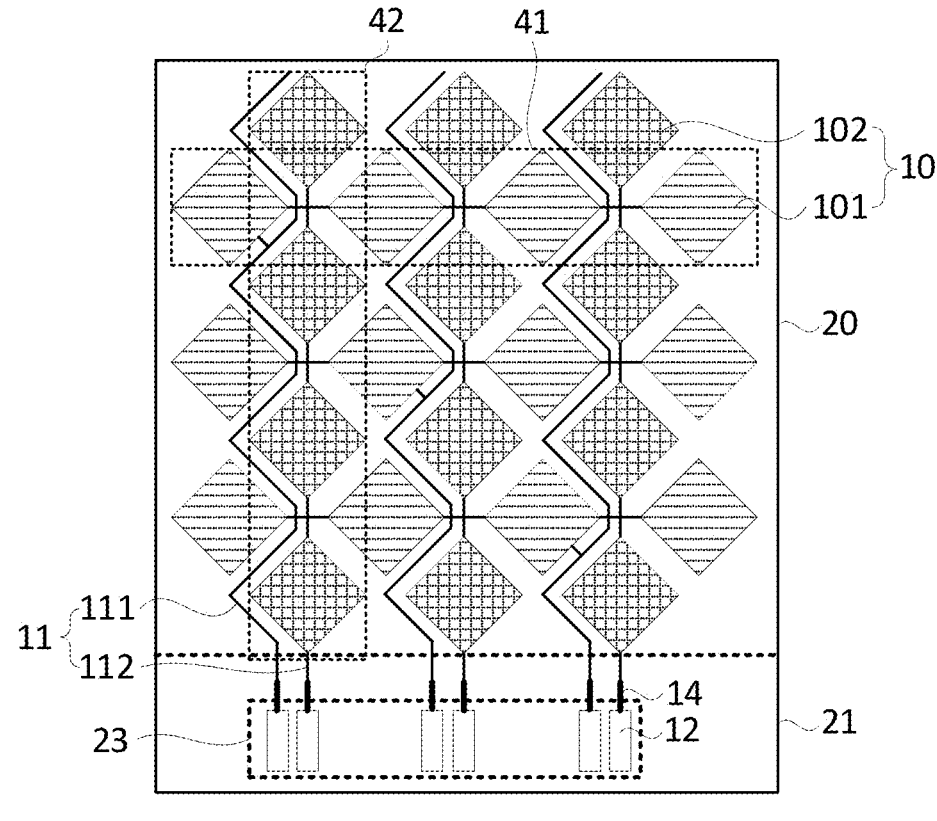
FIG. 15 is a structure diagram of another display panel according to an embodiment of the present disclosure.

FIG. 15 is a structure diagram of another display panel according to an embodiment of the present disclosure. As shown in FIG. 15, optionally, the multiple first touch wires 111 extend along the column direction and are arranged along the row direction, and the multiple first touch wires 111 are the same in length.

If the multiple first touch wires 111 are not uniformly distributed in the display region 20, the distribution density of the first touch wires 111 at each position of the display region 20 is different, and the first touch wires 111 form different reflected light at each position of the display region 20, affecting the overall visual effect of the display region 20.

As shown in FIG. 15, in the present embodiment, the multiple first touch wires 111 are configured to extend along the same direction and be arranged along the same direction, and the multiple first touch wires 111 are the same in length so that the first touch wires 111 are uniformly distributed in the display region 20, and the distribution density of the first touch wires 111 at each position of the display region 20 tends to be consistent, thereby solving the problem of different reflection at different positions of the display region 20 and improving the overall visual effect of the display region 20.

Figure 16:
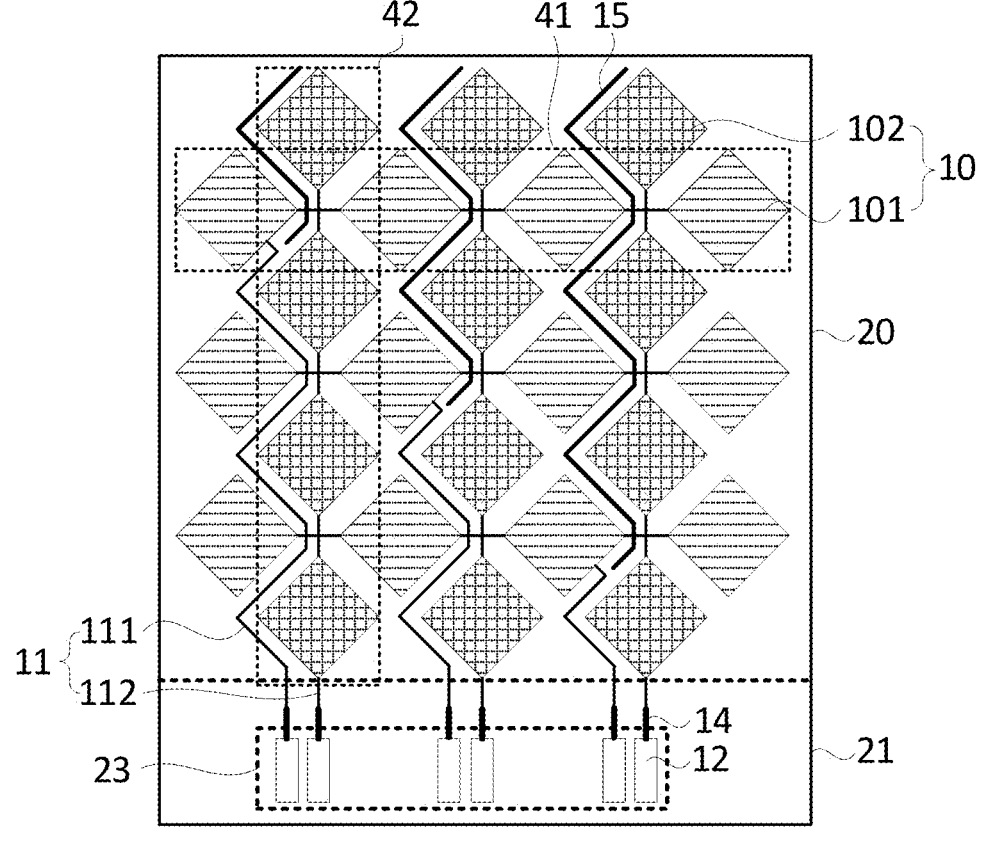
FIG. 16 is a structure diagram of another display panel according to an embodiment of the present disclosure.

FIG. 16 is a structure diagram of another display panel according to an embodiment of the present disclosure. As shown in FIG. 16, optionally, at least two first touch wires 111 are different in length, and the display region 20 also includes multiple virtual wires 15 disposed in the display region 20, where a virtual wire 15 of the virtual wires 15 is disposed in a gap between two adjacent touch electrode blocks 10. The virtual wires 15 extend along the column direction and are arranged along the row direction, the virtual wires 15 and the first touch wires 111 are arranged along the column direction, and the virtual wires 15 are insulated from the first touch wires 111.

When at least two first touch wires 111 are different in length, the distribution density of the first touch wires 111 at each position of the display region 20 is different, and the first touch wires 111 form different reflected light at each position of the display region 20, affecting the overall visual effect of the display region 20.

As shown in FIG. 16, in the present embodiment, the multiple virtual wires 15 corresponding to the multiple first touch wires 111 are disposed in the display region 20. Like the first touch wire 111, each virtual wire 15 is disposed in the gap between two adjacent touch electrode blocks 10, and the multiple virtual wires 15 extend along the column direction and are arranged along the row direction.

The virtual wires 15 and the first touch wires 111 are configured to be arranged along the column direction. The virtual wires 15 are used for compensating for the wire density of regions of the display region 20 where no first touch wires 111 are provided so that the wire density of the regions of the display region 20 where no first touch wires 111 are provided tends to be the same as wire density of regions of the display region 20 where the first touch wires 111 are provided, thereby solving the problem of different reflection at different positions of the display region 20 and improving the overall visual effect of the display region 20.

With continued reference to FIG. 16, the virtual wires 15 are insulated from the first touch wires 111 so as to prevent the touch signals on the first touch wires 111 from being transmitted to the virtual wires 15, thereby preventing touch signals on the virtual wires 15 from interfering with touch signals on touch electrode blocks 10 around the virtual wires 15

Figure 17:
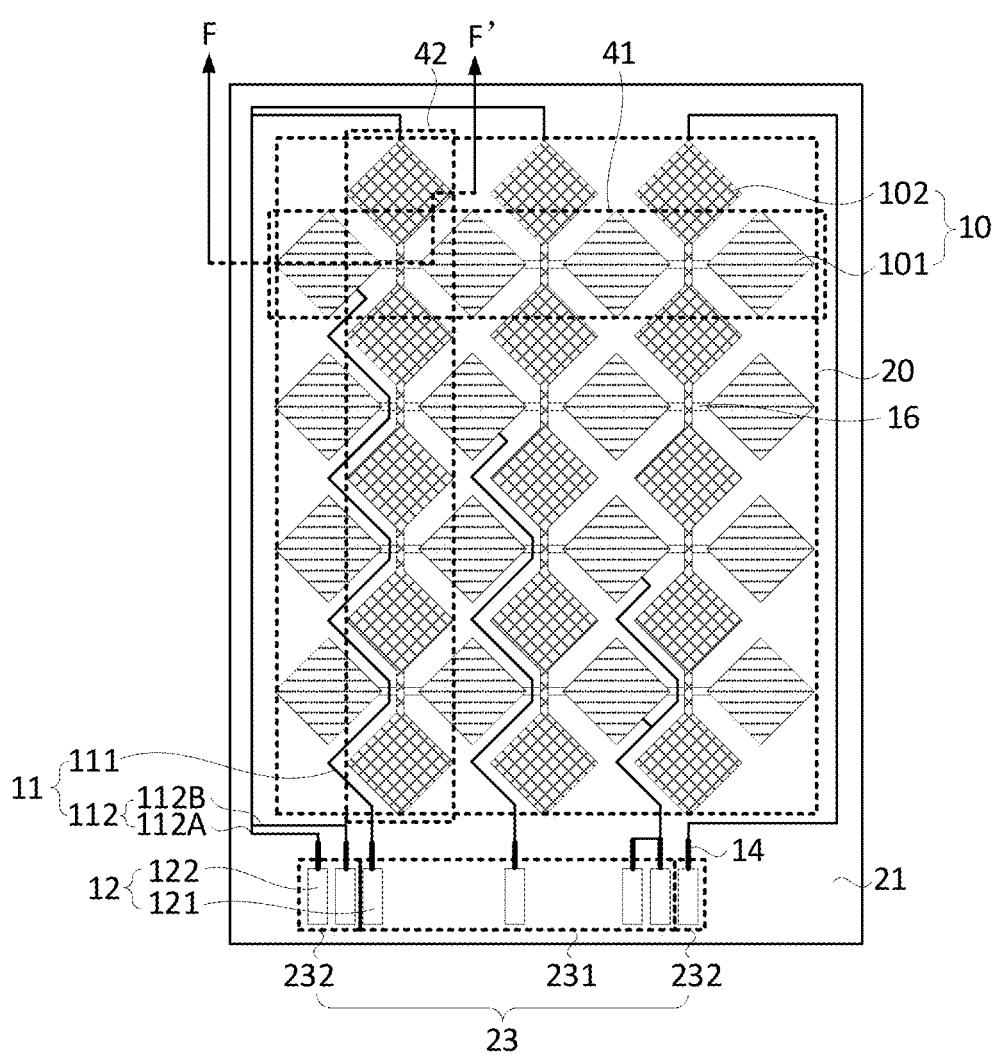
FIG. 17 is a structure diagram of another display panel according to an embodiment of the present disclosure.
Figure 18:
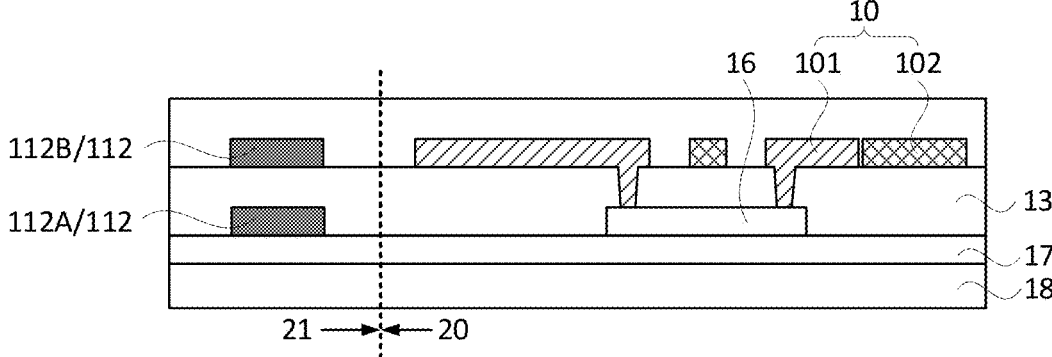
FIG. 18 is a sectional view of FIG. 17 taken along a line F-F'.
Figure 19:
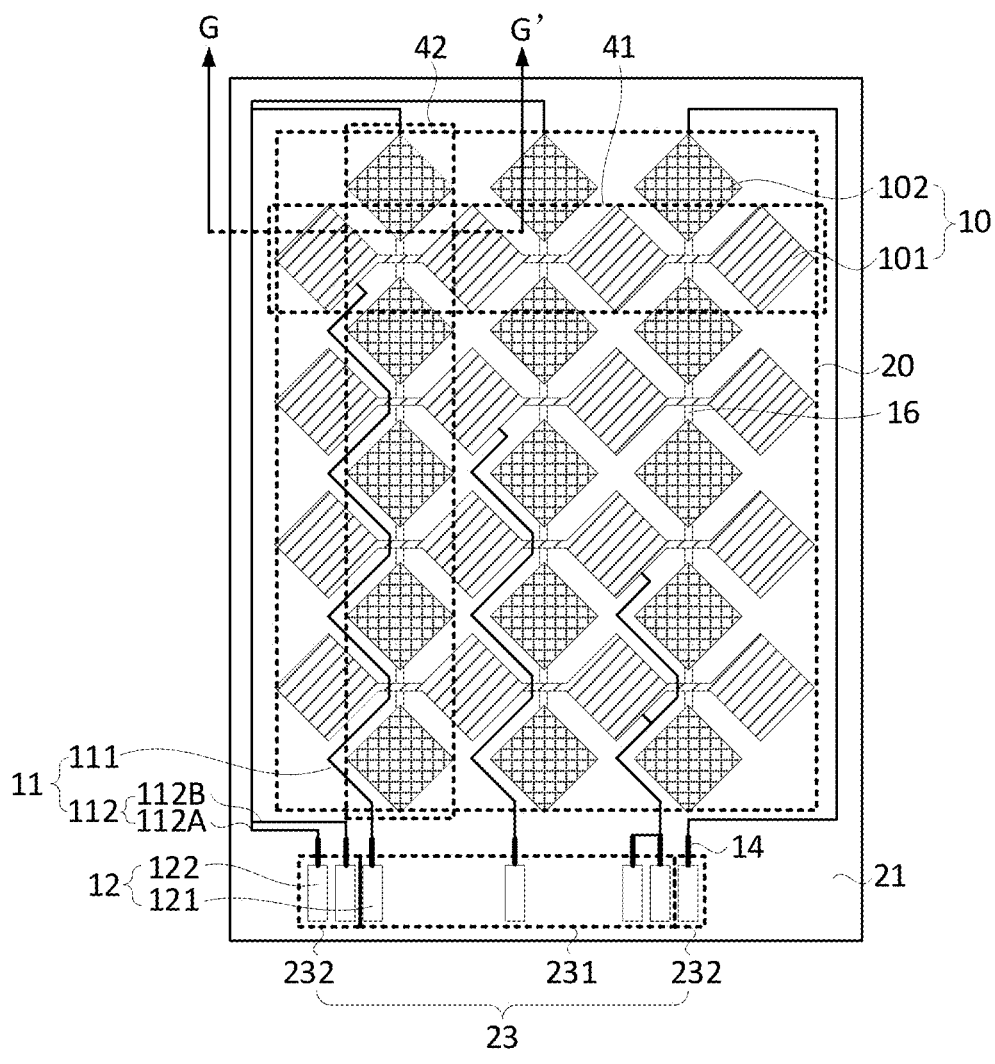
FIG. 19 is a structure diagram of another display panel according to an embodiment of the present disclosure.
Figure 20:
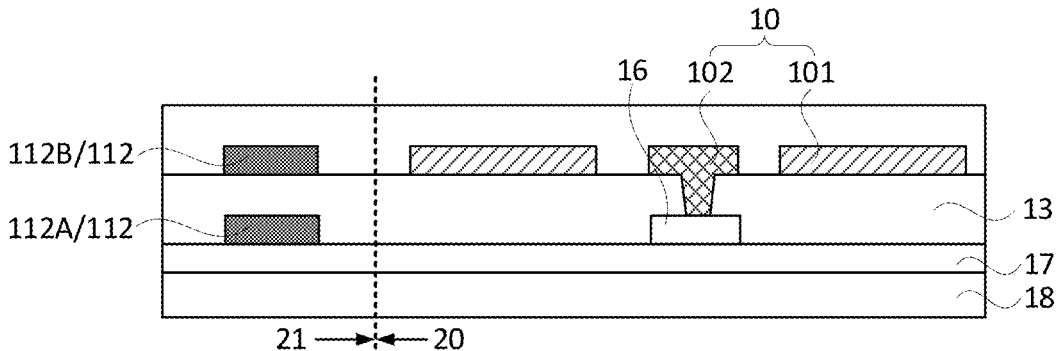
FIG. 20 is a sectional view of FIG. 19 taken along a line G-G'.

FIG. 17 is a structure diagram of another display panel according to an embodiment of the present disclosure. FIG. 18 is a sectional view of FIG. 17 taken along a line F-F'. FIG. 19 is a structure diagram of another display panel according to an embodiment of the present disclosure. FIG. 20 is a sectional view of FIG. 19 taken along a line G-G'. As shown in FIGS. 17 to 20, optionally, the first touch electrode blocks 101 and the second touch electrode blocks 102 are disposed in the same film, and the display panel also includes a bridge connection electrode 16 disposed in a different film from the first touch electrode blocks 101. Along the row direction, two adjacent first touch electrode blocks 101 are electrically connected through the bridge connection electrode 16. Alternatively, along the column direction, two adjacent second touch electrode blocks 102 are electrically connected through the bridge connection electrode 16. The multiple touch wires 11 also include the multiple second touch wires 112, where the second touch wires 112 are disposed in the non-display region 21. The multiple second touch wires 112 include the third touch subwire 112A and the fourth touch subwire 112B, where the third touch subwire 112A and the fourth touch subwire 112B are disposed in different films, and along the thickness direction of the display panel, the third touch subwire 112A and the fourth touch subwire 112B at least partially overlap. The third touch subwire 112A is disposed in the same film as one of the first touch electrode blocks 101 and the bridge connection electrode 16, and the fourth touch subwire 112B is disposed in the same film as the other of the first touch electrode blocks 101 and the bridge connection electrode 16.

Specifically, the first touch electrode blocks 101 and the second touch electrode blocks 102 may be disposed in the same film. As shown in FIGS. 17 and 18, the multiple second touch electrode blocks 102 arranged along the column direction may be directly connected, and the multiple first touch electrode blocks 101 arranged along the row direction are electrically connected in sequence through bridge connection electrodes 16 disposed in a different film from the second touch electrode blocks 102, thereby ensuring that the first touch electrodes 41 are insulated from the second touch electrodes 42.

In other embodiments, as shown in FIGS. 19 and 20, the multiple first touch electrode blocks 101 arranged along the row direction may be directly connected, and the multiple second touch electrode blocks 102 arranged along the column direction are electrically connected in sequence through the bridge connection electrodes 16 disposed in a different film from the first touch electrode blocks 101, thereby ensuring that the first touch electrodes 41 are insulated from the second touch electrodes 42.

Further, with continued reference to FIGS. 17 to 20, at least one touch wire 11 is configured to be the second touch wire 112, and the second touch wire 112 is disposed in the non-display region 21 so that the number of touch wires 11 (that is, first touch wires 111) disposed in the display region 20 is not too large, thereby reducing the impact of the first touch wires 111 on the display effect of the display region 20.

The multiple second touch wires 112 include at least the third touch subwire 112A and the fourth touch subwire 112B disposed in different films, and the third touch subwire 112A and the fourth touch subwire 112B overlap along the thickness direction of the display panel so as to reduce the occupied space of the third touch subwire 112A and the fourth touch subwire 112B in the non-display region 21, thereby reducing the width of the non-display region 21, increasing the screen-to-body ratio, and helping to meet the requirement for the narrow bezel.

Further, with continued reference to FIGS. 17 to 20, the third touch subwire 112A may be disposed in the same film as the bridge connection electrode 16 so as to reduce one conductive film, thereby reducing a production cost and the thickness of the display panel. Meanwhile, the third touch subwire 112A may be made of the same material as the bridge connection electrode 16 so that the third touch subwire 112A and the bridge connection electrode 16 may be prepared in the same process, thereby shortening a process time.

Similarly, the fourth touch subwire 112B may be disposed in the same film as the first touch electrode blocks 101 so as to reduce one conductive film, thereby reducing the production cost and the thickness of the display panel. Meanwhile, the fourth touch subwire 112B may be made of the same material as the first touch electrode blocks 101 so that the fourth touch subwire 112B and the first touch electrode blocks 101 may be prepared in the same process, thereby shortening the process time.

Figure 21:
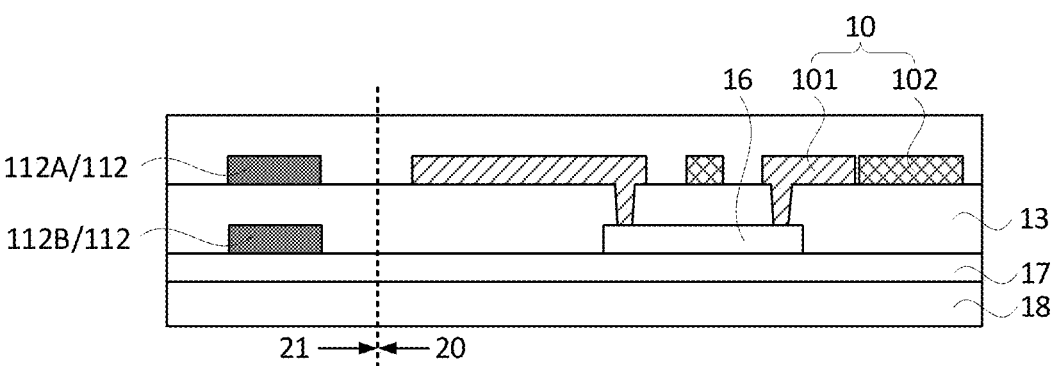
FIG. 21 is a partial sectional view of a display panel according to an embodiment of the present disclosure.
Figure 22:
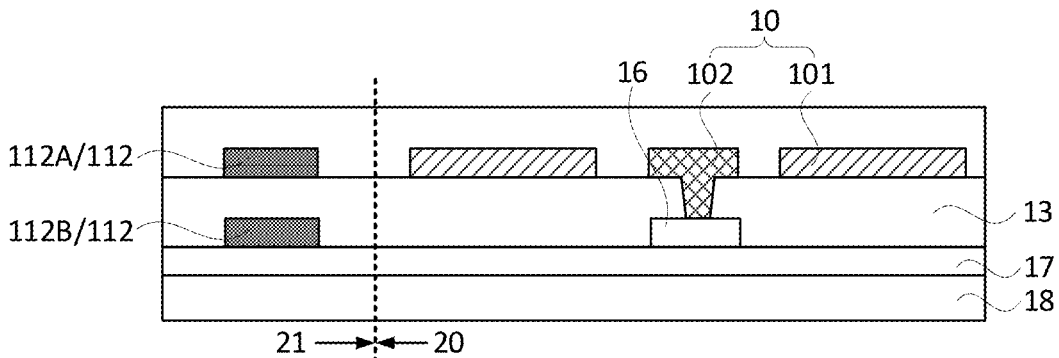
FIG. 22 is a partial sectional view of another display panel according to an embodiment of the present disclosure.

FIG. 21 is a partial sectional view of a display panel according to an embodiment of the present disclosure. FIG. 22 is a partial sectional view of another display panel according to an embodiment of the present disclosure. As shown in FIGS. 21 and 22, optionally, third touch subwires 112A may be disposed in the same film as first touch electrode blocks 101 so as to reduce one conductive film, thereby reducing a production cost and the thickness of the display panel. Meanwhile, the third touch subwires 112A may be made of the same material as the first touch electrodes 101 so that the third touch subwires 112A and the first touch electrodes 101 may be prepared in the same process, thereby shortening the process time.

Similarly, fourth touch subwires 112B may be disposed in the same film as bridge electrodes 16 so as to reduce one conductive film, thereby reducing the production cost and the thickness of the display panel. Meanwhile, the fourth touch subwires 112B may be made of the same material as the bridge electrodes 16 so that the fourth touch subwires 112B and the bridge electrodes 16 may be prepared in the same process, thereby shortening the process time.

With continued reference to FIGS. 1 to 4 and 6 to 22, optionally, the display panel also includes a touch substrate 17 and a display substrate 18. The display substrate 18 is used for implementing a display function. The multiple touch electrode blocks 10 and the multiple touch wires 11 may be disposed on the same side of the touch substrate 17. The touch substrate 17 is used for supporting the multiple touch electrode blocks 10 and the multiple touch wires 11. During the preparation of the display panel, the multiple touch electrode blocks 10 and the multiple touch wires 11 may be prepared on one side of the touch substrate 17, and then the touch substrate 17 with the multiple touch electrode blocks 10 and the multiple touch wires 11 prepared is adhered to the display substrate 18, but it is not limited thereto.

In other embodiments, the multiple touch electrode blocks 10 and the multiple touch wires 11 may be directly prepared on one side of the display substrate 18. In this case, the touch electrode blocks 10 and the multiple touch wires 11 are supported by the display substrate 18, and thus no touch substrate 17 needs to be provided.

With continued reference to FIGS. 17 to 22, optionally, the bridge connection electrode 16 may be disposed on a side of the touch electrode blocks 10 facing the display substrate 18, but it is not limited thereto.

Figure 23:
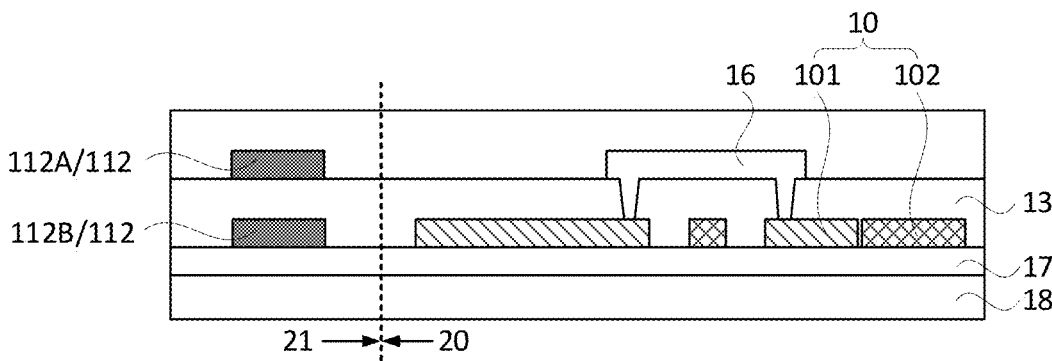
FIG. 23 is a partial sectional view of another display panel according to an embodiment of the present disclosure.

FIG. 23 is a partial sectional view of another display panel according to an embodiment of the present disclosure. As shown in FIG. 23, the bridge connection electrode 16 may be disposed on a side of the touch electrode blocks 10 facing away from the display substrate 18, which is not specifically limited in the embodiment of the present disclosure.

Figure 24:
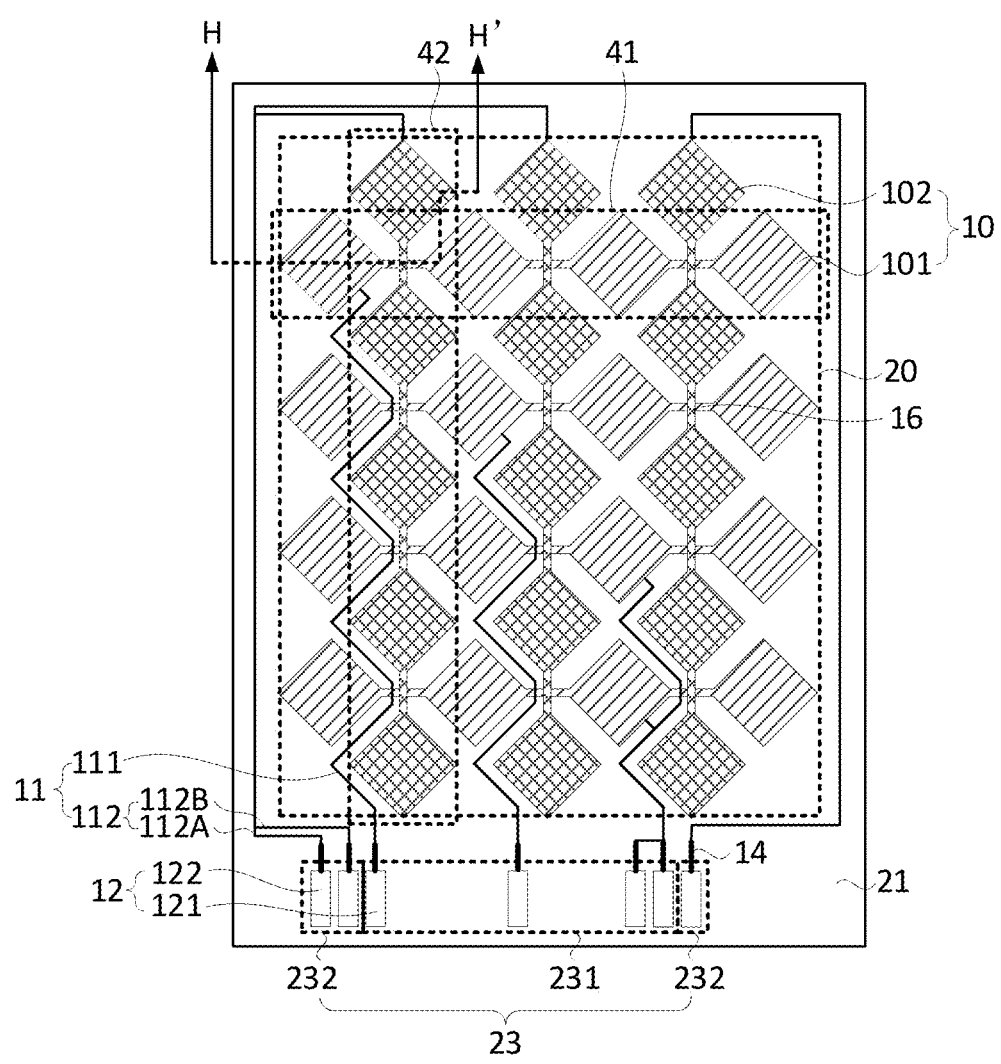
FIG. 24 is a structure diagram of another display panel according to an embodiment of the present disclosure.
Figure 25:
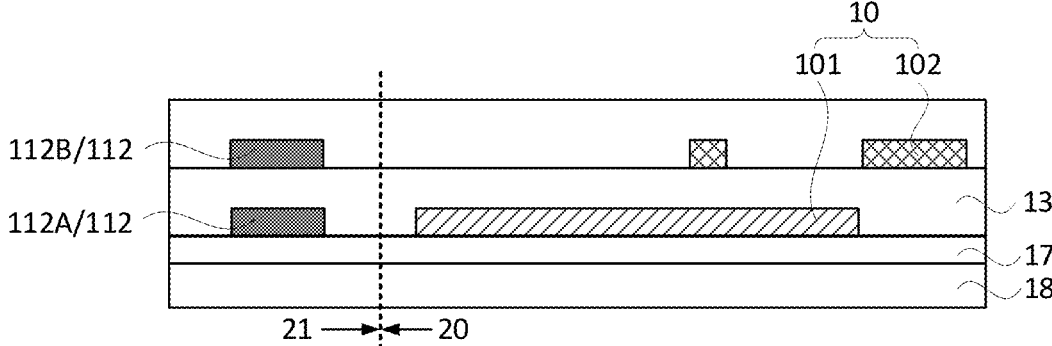
FIG. 25 is a sectional view of FIG. 24 taken along a line H-H'.
Figure 26:
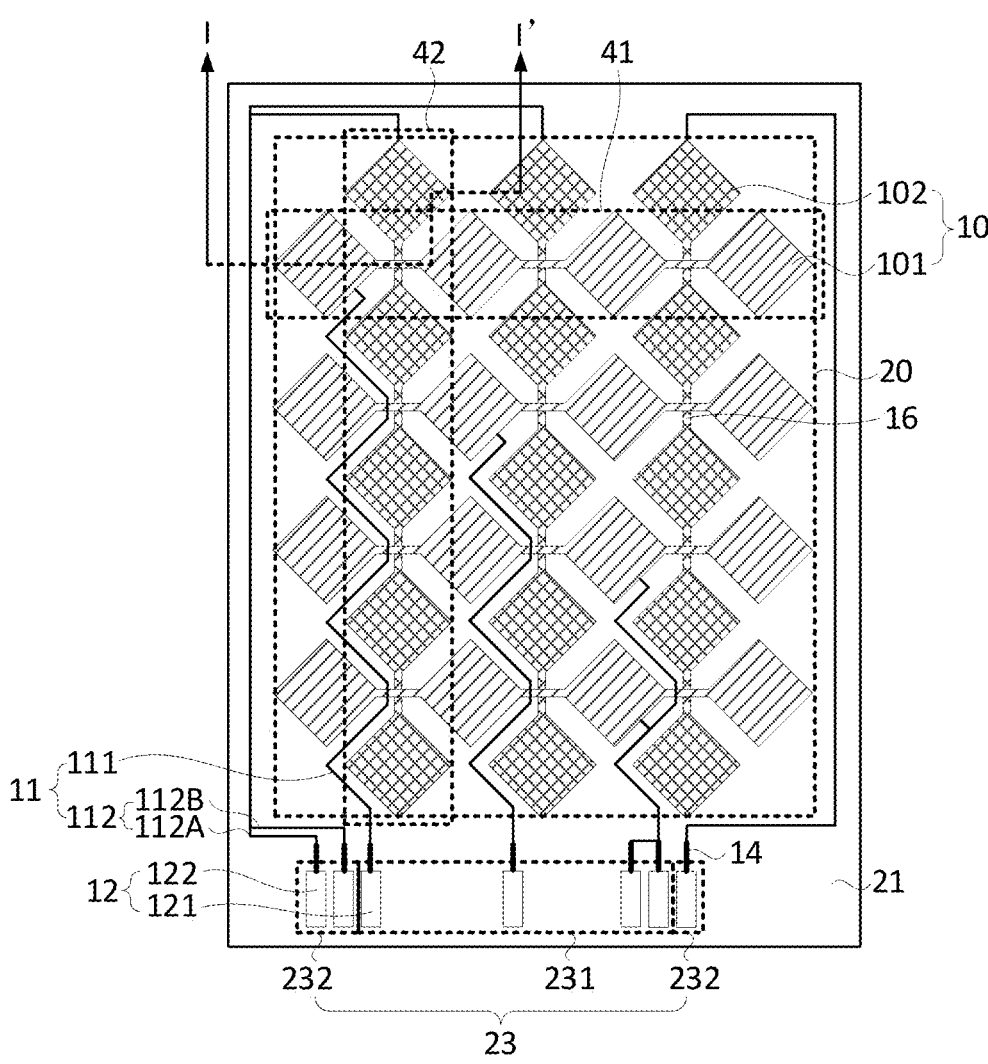
FIG. 26 is a structure diagram of another display panel according to an embodiment of the present disclosure.
Figure 27:
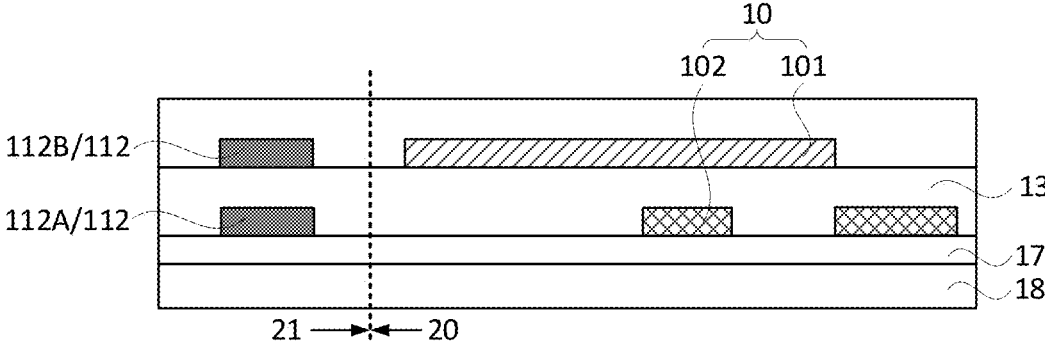
FIG. 27 is a sectional view of FIG. 26 taken along a line I-I'.

FIG. 24 is a structure diagram of another display panel according to an embodiment of the present disclosure. FIG. 25 is a sectional view of FIG. 24 taken along a line H-H'. FIG. 26 is a structure diagram of another display panel according to an embodiment of the present disclosure. FIG. 27 is a sectional view of FIG. 26 taken along a line I-I'. As shown in FIGS. 24 to 27, optionally, the first touch electrode blocks 101 and the second touch electrode blocks 102 are disposed in different films, the multiple touch wires 11 also include the multiple second touch wires 112, and the second touch wires 112 are disposed in the non-display region 21. The multiple second touch wires 112 include the third touch subwire 112A and the fourth touch subwire 112B, where the third touch subwire 112A and the fourth touch subwire 112B are disposed in different films and along the thickness direction of the display panel, the third touch subwire 112A and the fourth touch subwire 112B at least partially overlap. The third touch subwire 112A is disposed in the same film as one of the first touch electrode blocks 101 and the second touch electrode blocks 102, and the fourth touch subwire 112B is disposed in the same film as the other of the first touch electrode blocks 101 and the second touch electrode blocks 102.

Specifically, the first touch electrode blocks 101 and the second touch electrode blocks 102 may be disposed in different films. As shown in FIGS. 24 to 27, the multiple second touch electrode blocks 102 arranged along the column direction may be directly connected, and the multiple first touch electrode blocks 101 arranged along the row direction may also be directly connected, and it can be ensured that the first touch electrodes 41 are insulated from the second touch electrodes 42.

Further, with continued reference to FIGS. 24 to 27, at least one touch wire 11 is configured to be the second touch wire 112, and the second touch wire 112 is disposed in the non-display region 21 so that the number of touch wires 11 (that is, first touch wires 111) disposed in the display region 20 is too large, thereby reducing the impact of the first touch wires 111 on the display effect of the display region 20.

The multiple second touch wires 112 include at least the third touch subwires 112A and the fourth touch subwires 112B disposed in different films, and the third touch subwires 112A and the fourth touch subwires 112B overlap along the thickness direction of the display panel so as to reduce the occupied space of the third touch subwires 112A and the fourth touch subwires 112B in the non-display region 21, thereby reducing the width of the non-display region 21, increasing the screen-to-body ratio, and helping to meet the requirement for the narrow bezel.

Further, as shown in FIGS. 24 and 25, the third touch subwire 112A may be disposed in the same film as the first touch electrode blocks 101 so as to reduce one conductive film, thereby reducing the production cost and the thickness of the display panel. Meanwhile, the third touch subwire 112A may be made of the same material as the first touch electrode blocks 101 so that the third touch subwire 112A and the first touch electrode blocks 101 may be prepared in the same process, thereby shortening the process time.

Similarly, the fourth touch subwire 112B may be disposed in the same film as the second touch electrode blocks 102 so as to reduce one conductive film, thereby reducing the production cost and the thickness of the display panel. Meanwhile, the fourth touch subwire 112B may be made of the same material as the second touch electrode blocks 102 so that the fourth touch subwire 112B and the second touch electrode blocks 102 may be prepared in the same process, thereby shortening the process time.

With continued reference to FIGS. 26 and 27, optionally, the third touch subwires 112A may be disposed in the same film as the second touch electrodes 102 so as to reduce one number conductive film, thereby reducing the production cost and the thickness of the display panel. Meanwhile, the third touch subwires 112A may be made of the same material as the second touch electrodes 102 so that the third touch subwires 112A and the second touch electrodes 102 may be prepared in the same process, thereby shortening the process time.

Similarly, the fourth touch subwires 112B may be disposed in the same film as the first touch electrodes 101 so as to reduce one number of conductive film, thereby reducing the production cost and the thickness of the display panel. Meanwhile, the fourth touch subwires 112B may be made of the same material as the first touch electrodes 101 so that the fourth touch subwires 112B and the first touch electrodes 101 may be prepared in the same process, thereby shortening the process time.

In other embodiments, the third touch subwire 112A and the fourth touch subwire 112B may be disposed in the same films as other conductive structures in the display panel, separately, thereby reducing the production cost and the thickness of the display panel and shortening the process time. The details are not repeated here.

It is to be noted that the first touch electrode blocks 101 may be disposed on the side of the touch electrode blocks 10 adjacent to the display substrate 18 (as shown in FIGS. 24 and 25), or the first touch electrode blocks 101 may be disposed on the side of the touch electrode blocks 10 facing away from the display substrate 18 (as shown in FIGS. 26 and 27), which is not specifically limited in the embodiment of the present disclosure.

Figure 28:
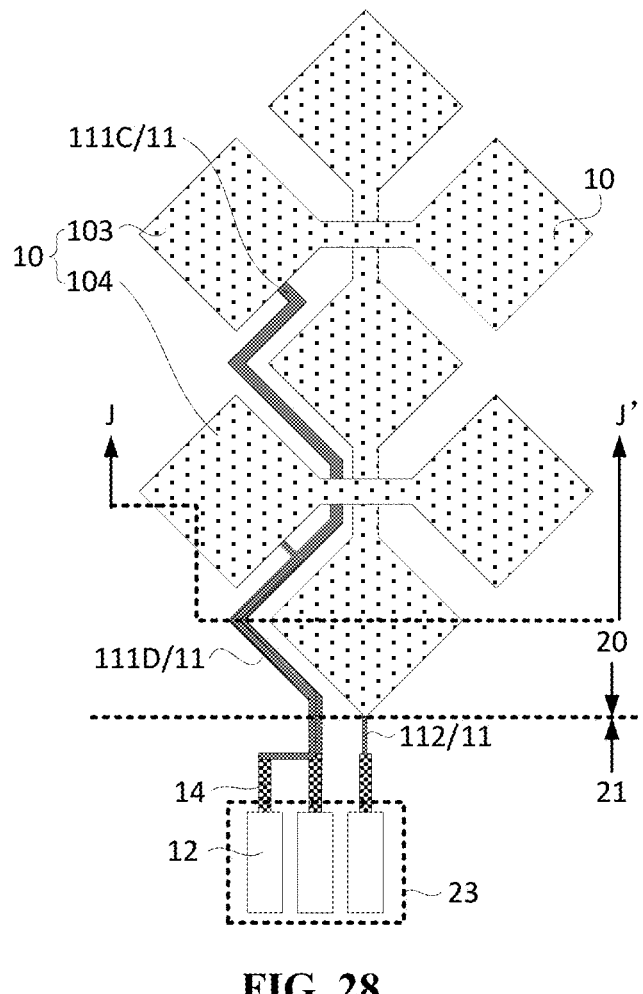
FIG. 28 is a partial structure diagram of a display panel according to an embodiment of the present disclosure.
Figure 29:
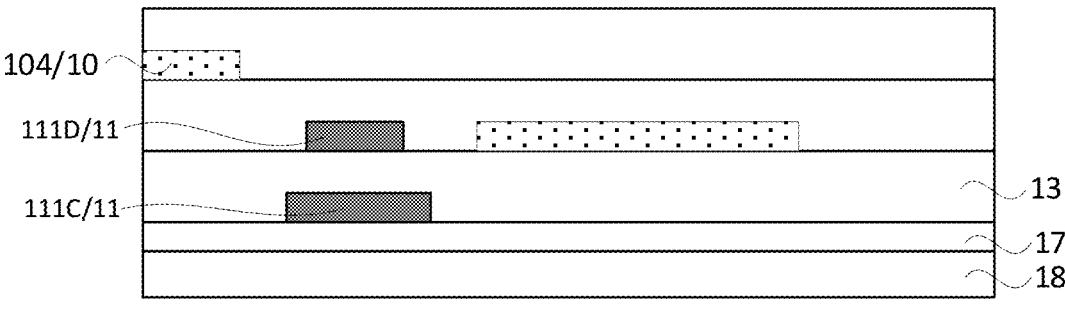
FIG. 29 is a sectional view of FIG. 28 taken along a line J-J'.

FIG. 28 is a partial structure diagram of a display panel according to an embodiment of the present disclosure. FIG. 29 is a sectional view of FIG. 28 taken along a line J-J'. As shown in FIGS. 28 and 29, optionally, the non-display region 21 includes the bonding region 23 disposed on a side of the display region 20, the bonding region 23 includes the multiple bonding pads 12, and a touch wire 11 of the touch wires 11 is electrically connected to a bonding pad 12 of the bonding pads 12 correspondingly. The multiple touch electrode blocks 10 include a third touch electrode block 103 and a fourth touch electrode block 104, where the distance between the third touch electrode block 103 and the bonding region 23 is greater than the distance between the fourth touch electrode block 104 and the bonding region 23. A width of a touch wire 11 electrically connected to the third touch electrode block 103 is larger than a width of a touch wire 11 electrically connected to the fourth touch electrode block 104.

Specifically, as shown in FIGS. 28 and 29, the bonding region 23 is used for arranging the bonding pads 12 bonded to the touch chip, the touch wires 11 need to be led to the bonding pads 12 to be electrically connected to the bonding pads 12, and the bonding pads 12 are bonded and connected to the touch chip so that the electrical connections between the touch electrode blocks 10 and the touch chip can be achieved through the bonding process, that is, each touch electrode block 10 is electrically connected to the bonding pad 12 through the touch wire 11 connected correspondingly and then is electrically connected to the touch chip. The touch chip sends the touch driving signals to the touch electrode blocks 10 and receives the touch sensing signals from the touch electrode blocks 10, thereby implementing the touch function.

The farther the touch electrode block 10 (for example, the third touch electrode block 103) is from the bonding region 23, the longer the length of the touch wire 11 (for example, a touch wire 111C in FIGS. 28 and 29) connected to the touch electrode block 10, and the greater the transmission loss of the touch signal on the touch wire 11. Similarly, the closer the touch electrode block 10 (for example, the fourth touch electrode block 104) is to the bonding region 23, the shorter the length of the touch wire 11 (for example, a touch wire 111D in FIGS. 28 and 29) connected to the touch electrode block 10, and the smaller the transmission loss of the touch signal on the touch wire 11. Thus, the touch signals from the touch electrode blocks 10 at different positions have different transmission losses on the touch wires 11, affecting the touch accuracy.

In the present embodiment, the farther the touch electrode block 10 (for example, the third touch electrode block 103) is from the bonding region 23, the greater width the touch wire 11 (for example, the touch wire 111C in FIGS. 28 and 29) connected to the touch electrode block 10 has; the closer the touch electrode block 10 (for example, the fourth touch electrode block 104) is to the bonding region 23, the smaller width the touch wire 11 (for example, the touch wire 111D in FIGS. 28 and 29) connected to the touch electrode block 10 has. That is, a longer touch wire 11 (for example, the touch wire 111C) is configured to have the greater width than a shorter touch wire 11 (for example, the touch wire 111D) so that the resistivity of the longer touch wire 11 (for example, the touch wire 111C) is reduced, the transmission loss of the touch signal on the touch wire 11 is reduced, the difference between the transmission losses of the touch signals from the touch electrode blocks 10 at different positions on the touch wire 11 is compensated for to a certain extent, and the touch accuracy is improved.

Figure 30:
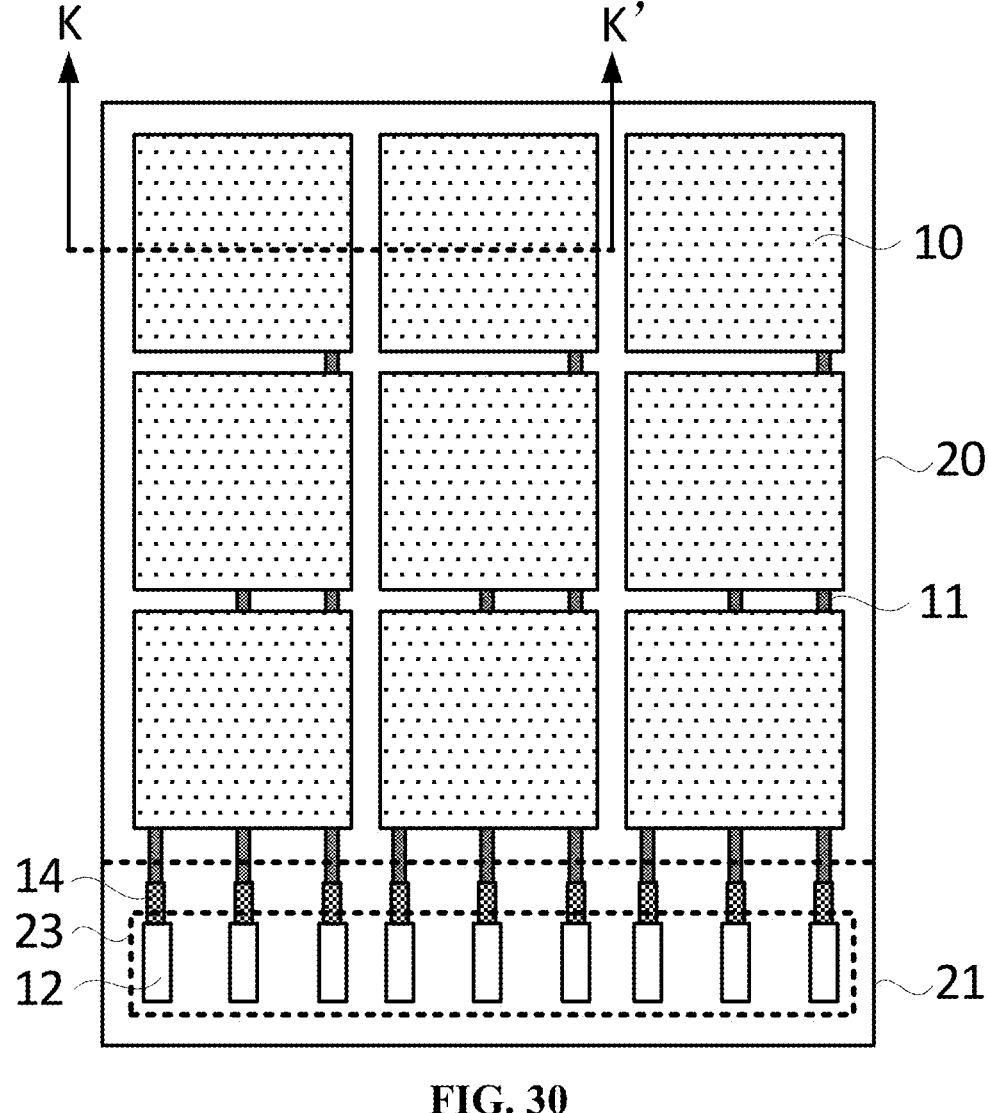
FIG. 30 is a structure diagram of another display panel according to an embodiment of the present disclosure.
Figure 31:
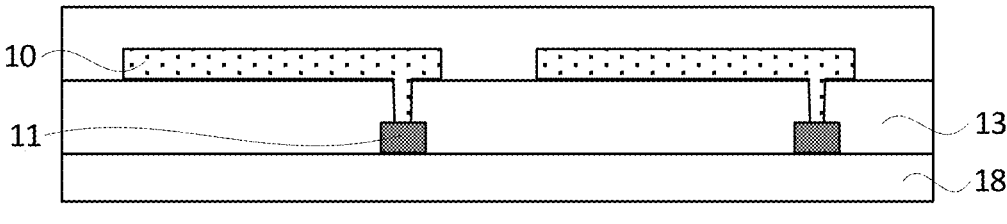
FIG. 31 is a sectional view of FIG. 30 taken along a line K-K'.

FIG. 30 is a structure diagram of another display panel according to an embodiment of the present disclosure. FIG. 31 is a sectional view of FIG. 30 taken along a line K-K'. Optionally, the multiple touch electrode blocks 10 are arranged in an array and are insulated from each other.

Specifically, as shown in FIGS. 30 and 31, the multiple touch electrode blocks 10 are arranged in an array in the display region 20, and the touch electrode blocks 10 are insulated from each other, constituting a self-capacitive touch structure. Each touch electrode block 10 can form a self-capacitance with the ground, and an external capacitance formed by the finger or another touch body changes the self-capacitance formed between the touch electrode block 10 and the ground so that a specific position of a touch point can be detected.

With continued reference to FIGS. 30 and 31, the multiple touch electrode blocks 10 may be disposed in the same film so that the number of films can be reduced, and the thickness of the display panel can be reduced, thereby facilitating the design of a thin and light display panel.

With continued reference to FIGS. 30 and 31, optionally, along the thickness direction of the display panel, the first touch wires 111 at least partially overlap the touch electrode blocks 10.

With the requirement for higher touch accuracy, the number of touch electrode blocks 10 increases, and the number of touch wires 11 also increases. If the first touch wire 111 is disposed in the gap between two adjacent touch electrode blocks 10, the gap between adjacent touch electrode blocks 10 needs to be relatively large to dispose the first touch wire 111, and the touch function cannot be implemented at the gap, affecting the touch accuracy of the display region 20.

With continued reference to FIGS. 30 and 31, in the present embodiment, the first touch wires 111 and the touch electrode blocks 10 are configured to overlap along the thickness direction of the display panel so that the first touch wire 111 can no longer be disposed in the gap between two adjacent touch electrode blocks 10, that is, the gap between two adjacent touch electrode blocks 10 no longer needs to be used for providing the first touch wire 111, thereby reducing the width of the gap between two adjacent touch electrode blocks 10 and helping to improve the touch accuracy of the display region 20.

In the present embodiment, the width of the gap between adjacent touch electrode blocks 10 may be smaller than or equal to the width of the touch wire 11 so that the gap between adjacent touch electrode blocks 10 has the smaller width, thereby improving the touch accuracy of the display region 20, but it is not limited thereto.

Figure 32:
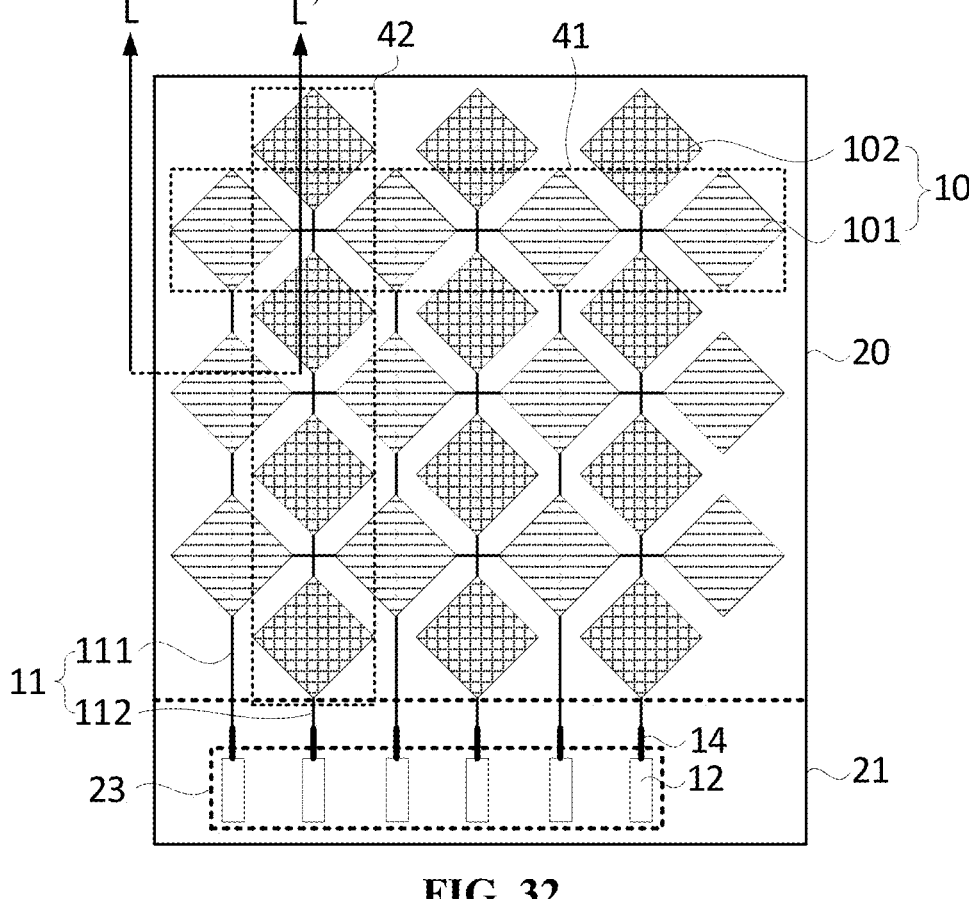
FIG. 32 is a structure diagram of another display panel according to an embodiment of the present disclosure.
Figure 33:
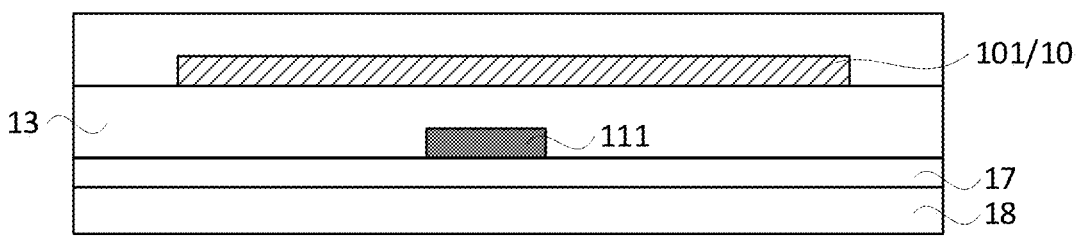
FIG. 33 is a sectional view of FIG. 32 taken along a line L-L'.

FIG. 32 is a structure diagram of another display panel according to an embodiment of the present disclosure. FIG. 33 is a sectional view of FIG. 32 taken along a line L-L'. As shown in FIGS. 32 and 33, when the multiple touch electrode blocks 10 are mutual capacitive touch structures, the first touch wires 111 and the touch electrode blocks 10 may be configured to overlap along the thickness direction of the display panel so that the first touch wires 111 are no longer disposed in gaps between the first touch electrodes 41 and the second touch electrodes 42, thereby reducing the width of the gaps between the first touch electrodes 41 and the second touch electrodes 42. The relatively small width of the gaps between the first touch electrodes 41 and the second touch electrodes 42 is beneficial for increasing a variation of the mutual capacitance between the first touch electrodes 41 and the second touch electrodes 42, thereby improving the touch accuracy.

It is to be noted that, in any one of the preceding embodiments, the touch electrode blocks 10 may all be configured to be transparent electrodes so that the touch electrode blocks 10 can be prevented from obstructing light and affecting the display effect of the display region 20.

A material of the touch electrode blocks 10 may include any one or more of indium tin oxide (ITO), indium zinc oxide (IZO), antimony tin oxide (ATO), aluminum zinc oxide (AZO) and zinc oxide (ZnO) so that the touch electrode blocks 10 have relatively good conductivity while the light transmittance of the touch electrode blocks 10 is ensured.

Figure 34:
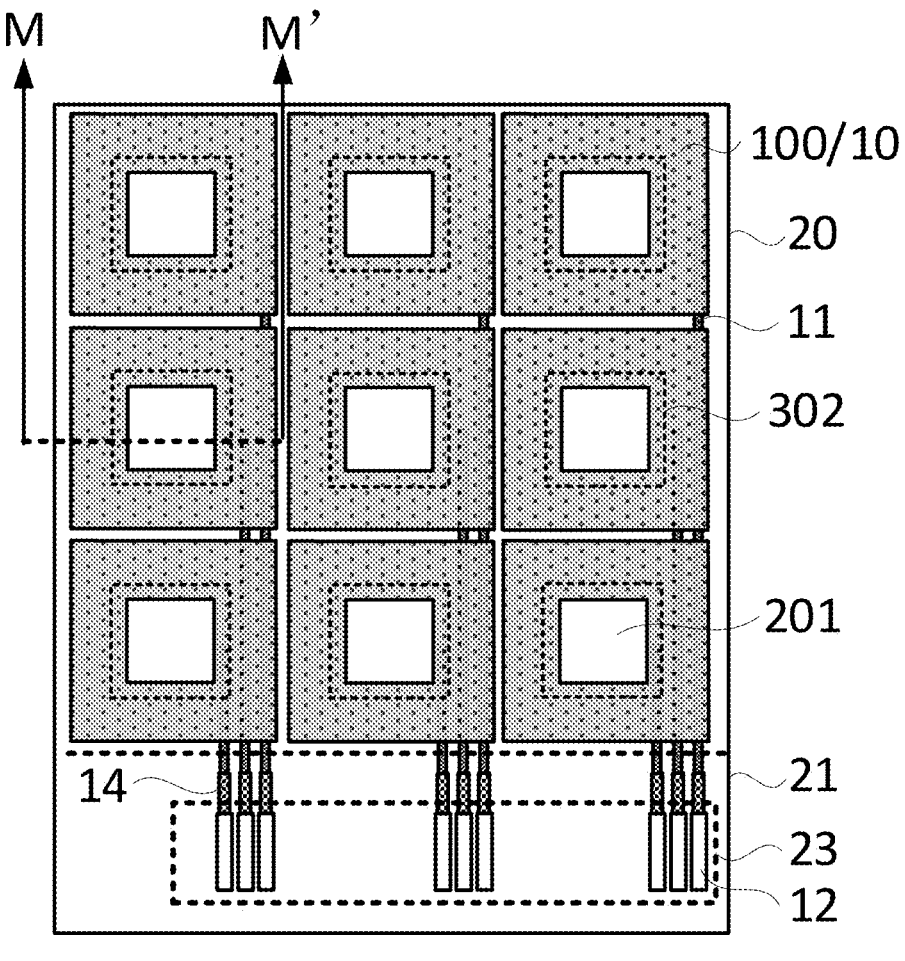
FIG. 34 is a structure diagram of another display panel according to an embodiment of the present disclosure.
Figure 35:
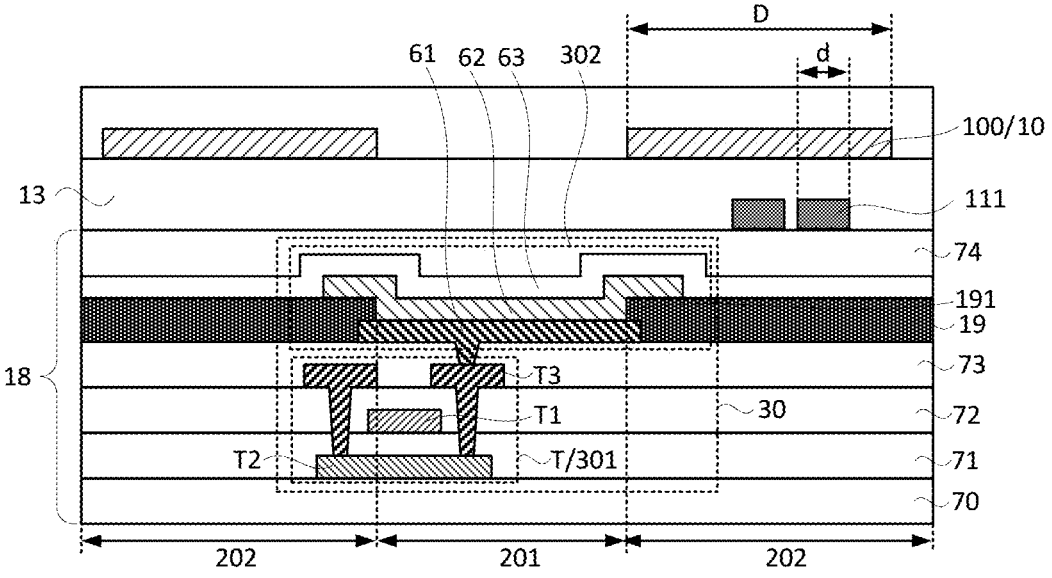
FIG. 35 is a sectional view of FIG. 34 taken along a line M-M'.

FIG. 34 is a structure diagram of another display panel according to an embodiment of the present disclosure. FIG. 35 is a sectional view of FIG. 34 taken along a line M-M'. As shown in FIGS. 34 and 35, optionally, the display region 20 also includes an opening region 201 and a non-opening region 202, the display region 20 also includes multiple light-emitting elements 302 arranged in an array, and along the thickness direction of the display panel, at least part of a light-emitting element of the light-emitting elements 302 is disposed in the opening region 201. The touch electrode blocks 10 have a grid structure, which includes grid wires 100 disposed in the non-opening region 202. A first touch wire 111 of the first touch wires 111 at least partially overlap a grid wire 100 of the grid wires 100 along the thickness direction of the display panel. The grid wire 100 has a width D, and the first touch wire 111 has a maximum width d, where D≥2*d.

Specifically, as shown in FIGS. 34 and 35, the display region 20 includes the multiple light-emitting elements 302 arranged in an array. Using an example where the display panel is an organic light-emitting diode (OLED) display panel, the light-emitting elements 302 may be OLEDs. In this case, each light-emitting element 302 may include, but is not limited to, an anode 61, an emission layer 62 and a cathode 63 that are stacked.

The emission layer 62 may be an organic emission layer (EML). Electrons are injected into the emission layer 62 through the cathode 63, holes are injected into the emission layer 62 through the anode 61, and the electrons and the holes are recombined in the emission layer 62 to emit light.

With continued reference to FIGS. 34 and 35, for example, the display panel may also include multiple pixel driving circuits 301 arranged in an array, where each pixel driving circuit 301 may include at least one transistor T. The transistor T may include, but is not limited to, a gate layer T1, an active layer T2 and a source-drain electrode layer T3 that are stacked.

Further, the multiple pixel driving circuits 301 and the multiple light-emitting elements 302 are electrically connected correspondingly, and the light-emitting elements 302 and the pixel driving circuits 301 connected thereto may constitute sub-pixels 30 of the display panel. The pixel driving circuits 301 are configured to transmit drive currents to the light-emitting elements 302 under the action of signals of drive signal lines (such as scan signal lines, data signal lines or power signal lines) on the display panel, thereby supplying the drive currents to the light-emitting elements 302. In this case, electrons and holes are injected into the emission layer 62 from the cathode 63 and the anode 61 respectively, and excitons are formed in the emission layer 62 and emissive molecules are excited so that the emission layer 62 emits visible light.

With continued reference to FIGS. 34 and 35, a pixel defining layer 19 is provided between the anode 61 and the cathode 63. A pixel opening 191 is disposed in the pixel defining layer 19, and the emission layer 62 is disposed in the pixel opening 191, where a region where the pixel opening 191 is located is the opening region 201, and a region of the display region 20 other than the opening region 201 is the non-opening region 202.

Optionally, a hole injection layer (HIL) and a hole transport layer (HTL) may be provided between the anode 61 and the emission layer 62, and an electron transport layer (ETL) and an electron injection layer (EIL) may be provided between the emission layer 62 and the cathode 63. The hole transport layer (HTL) mainly functions to transfer holes to the emission layer 62, the electron transport layer (ETL) mainly functions to transfer electrons to the emission layer 62, the hole injection layer (HIL) mainly improves an ability to transfer holes from the anode 61 to the emission layer 62, and the electron injection layer (EIL) mainly improves an ability to transfer electrons from the cathode 63 to the emission layer 62, thereby helping to reduce a drive voltage of the light-emitting element 302.

With continued reference to FIGS. 34 and 35, the touch electrode blocks 10 have the grid structure, and the grid wires 100 of the grid structure are disposed in the non-opening region 202 so that the grid wires 100 do not block the opening region 201, thereby reducing an impact of the touch electrode blocks 10 on the display effect of the display region 20.

It is to be noted that when the touch electrode blocks 10 adopt the grid structure, the material of the touch electrode blocks 10 may include at least one of copper (Cu), aluminum (Al), molybdenum (Mo), gold (Au), niobium (Nb) or titanium (Ti). That is, the material of the touch electrode blocks 10 may be any one of the preceding materials or an alloy of any two or more of the preceding materials to achieve good conductivity, but it is not limited thereto.

With continued reference to FIGS. 34 and 35, along the thickness direction of the display panel, the first touch wires 111 at least partially overlap the grid wires 100 so that the planar distribution area of the first touch wires 111 and the grid wires 100 is reduced in the display region 20, thereby helping to reduce an impact of the first touch wires 111 and the grid wires 100 on the display effect of the display region 20.

As described above, the first touch wires 111 form different reflected light at each position of the display region 20, affecting the overall visual effect of the display region 20.

As shown in FIGS. 34 and 35, in the present embodiment, the width D of the grid wires 100 and the maximum width d of the first touch wires 111 are configured to satisfy that D≥2*d so that most of the first touch wires 111 can be covered by the grid wires 100 along the thickness direction of the display panel, thereby solving the problem of different reflection of the first touch wires 111 at different positions of the display region 20 and helping to improve the overall visual effect of the display region 20.

With continued reference to FIGS. 34 and 35, optionally, the display substrate 18 may also include at least one film structure of a base substrate 70, a gate insulating layer 71, an interlayer insulating layer 72, a planarization layer 73 or a thin film encapsulation layer 74.

The base substrate 70 may be used for supporting various structures in the display substrate 18.

The gate insulating layer 71 is disposed between the gate layer T1 and the active layer T2 for insulation.

The interlayer insulating layer 72 is disposed between the active layer T2 and the source-drain electrode layer T3 for insulation.

The planarization layer 73 is disposed between the source-drain electrode layer T3 and the anode 61 for planarization.

The thin film encapsulation layer 74 is disposed on a side of the sub-pixels 30 facing away from the base substrate 70 for water and oxygen protection of the sub-pixels 30. The thin film encapsulation layer 74 may include a three-layer structure of an inorganic layer/an organic layer/an inorganic layer and has the advantages of lightness, thinness and flexibility while isolating water vapor.

It is to be noted that film structures of the display panel are not limited to the preceding embodiment and may be specifically arranged by those skilled in the art according to actual requirements.

In other embodiments, when the multiple touch electrode blocks 10 adopt the mutual capacitive touch structures, the touch electrode blocks 10 may be configured to have the grid structure. The details are not repeated here.

Figure 36:
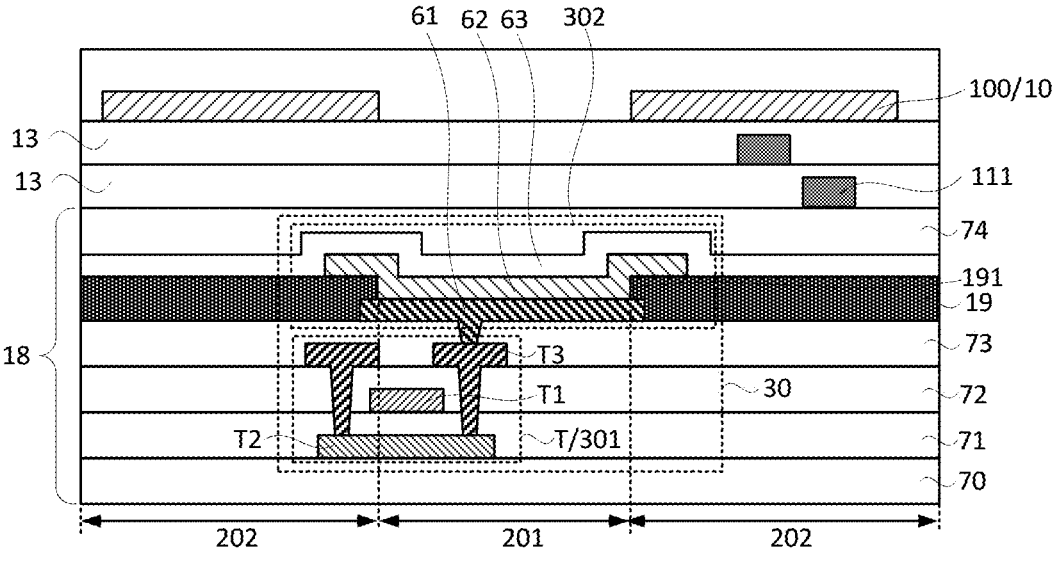
FIG. 36 is a partial sectional view of another display panel according to an embodiment of the present disclosure.
Figure 37:
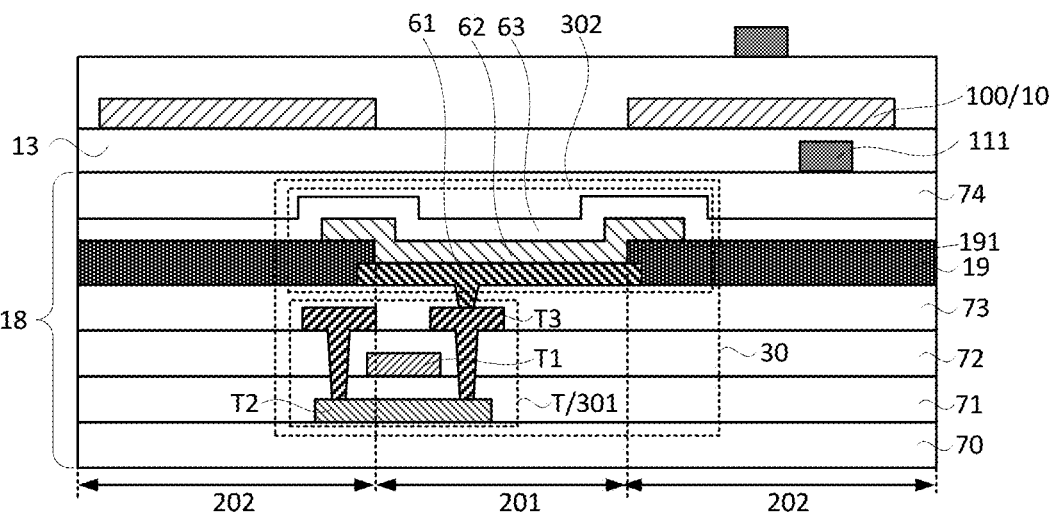
FIG. 37 is a partial sectional view of another display panel according to an embodiment of the present disclosure.

FIG. 36 is a partial sectional view of another display panel according to an embodiment of the present disclosure. FIG. 37 is a partial sectional view of another display panel according to an embodiment of the present disclosure. As shown in FIGS. 36 and 37, since other structures are also disposed in films of the display region 20, the space available for providing the first touch wire 111 in each film is limited. In the present embodiment, at least two first touch wires 111 are disposed in different films, that is, the multiple first touch wires 111 are distributed in different films so that more first touch wires 111 can be arranged in the display region 20.

Along the thickness direction of the display panel, the at least two first touch wires 111 disposed in different films may be disposed on the same side of the touch electrode blocks 10 (as shown in FIG. 36), or the at least two first touch wires 111 disposed in different films may be disposed on different sides of the touch electrode blocks 10 (as shown in FIG. 37), which is not specifically limited in the embodiment of the present disclosure.

Figure 38:
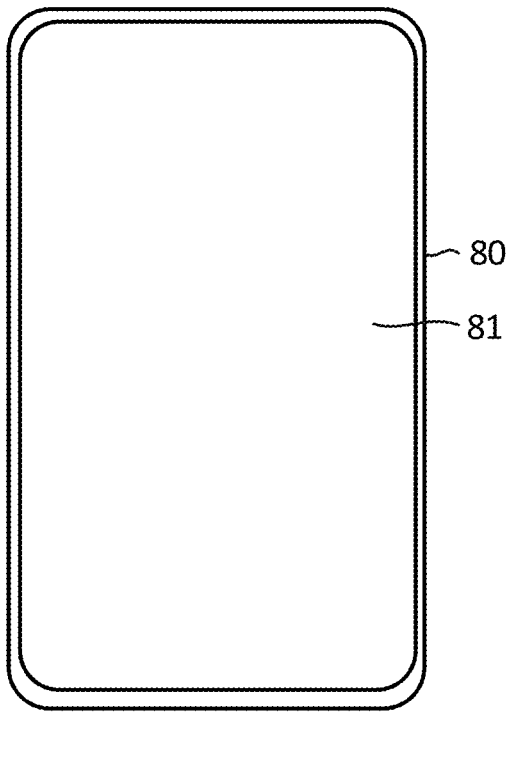
FIG. 38 is a structure diagram of a display device according to an embodiment of the present disclosure.

Based on the same inventive concept, embodiments of the present disclosure also provide a display device. FIG. 38 is a structure diagram of a display device according to an embodiment of the present disclosure. As shown in FIG. 38, a display device 80 includes the display panel 81 according to any embodiment of the present disclosure. Therefore, the display device 80 according to the embodiment of the present disclosure has the technical effects of the technical solution in any one of the preceding embodiments, and structures the same as or corresponding to those in the preceding embodiments and the explanation of terms are not repeated here.

The display device 80 according to the embodiment of the present disclosure may be a phone shown in FIG. 38 or may be any electronic product having a display function, including, but not limited to the following categories: a television, a laptop, a desktop display, a tablet computer, a digital camera, a smart bracelet, smart glasses, a vehicle-mounted display, a medical device, an industrial control device and a touch interactive terminal, and no special limitations are made thereto in the embodiment of the present disclosure.

The preceding embodiments do not limit the scope of the present disclosure. It is to be understood by those skilled in the art that various modifications, combinations, sub-combinations and substitutions may be made according to design requirements and other factors. Any modifications, equivalent substitutions, improvements and the like made within the spirit and principle of the present disclosure are within the scope of the present disclosure.

What is claimed is:

1. A display panel, comprising a plurality of touch electrode blocks and a plurality of touch wires, wherein a touch wire of the plurality of touch wires is electrically connected to at least one touch electrode block of the plurality of touch electrode blocks;

the display panel further comprises a display region and a non-display region disposed on at least one side of the display region, wherein the plurality of touch electrode blocks are disposed in the display region;

the non-display region comprises a bonding region disposed on a side of the display region, and the bonding region comprises a plurality of bonding pads;

the plurality of touch wires comprise a plurality of first touch wires, wherein at least part of a first touch wire of the plurality of first touch wires is disposed in the display region, and a first end of the first touch wire is electrically connected to a touch electrode block of the plurality of touch electrode blocks, and a second end of the first touch wire is electrically connected to a bonding pad of the plurality of bonding pads; and at least two first touch wires of the first touch wires are disposed in different films;

wherein the display region further comprises an opening region and a non-opening region;

the display region further comprises a plurality of light-emitting elements arranged in an array;

along a thickness direction of the display panel, at least part of a light-emitting element of the light-emitting elements is disposed in the opening region;

the touch electrode blocks have a grid structure, and the grid structure comprises grid wires disposed in the non-opening region;

along the thickness direction of the display panel, a first touch wire of the first touch wires at least partially overlaps a grid wire of the grid wires; and the grid wire has a width D, and the first touch wire has a maximum width d, wherein $D \geq 2*d$.

2. The display panel according to claim 1, wherein along the thickness direction of the display panel, the at least two first touch wires disposed in different films at least partially overlap each other.

3. The display panel according to claim 2, wherein the non-display region comprises a plurality of connection wires;

a touch wire of the touch wires is electrically connected to a connection wire of the connection wires, and a connection wire of the connection wires is electrically connected to a bonding pad of the bonding pads; and the plurality of connection wires are disposed in a same film.

4. A display panel, comprising a plurality of touch electrode blocks and a plurality of touch wires, wherein a touch wire of the plurality of touch wires is electrically connected to at least one touch electrode block of the plurality of touch electrode blocks;

the display panel further comprises a display region and a non-display region disposed on at least one side of the display region, wherein the plurality of touch electrode blocks are disposed in the display region;

the non-display region comprises a bonding region disposed on a side of the display region, and the bonding region comprises a plurality of bonding pads;

the plurality of touch wires comprise a plurality of first touch wires, wherein at least part of a first touch wire of the plurality of first touch wires is disposed in the display region, and a first end of the first touch wire is electrically connected to a touch electrode block of the plurality of touch electrode blocks, and a second end of the first touch wire is electrically connected to a bonding pad of the plurality of bonding pads; and at least two first touch wires of the first touch wires are disposed in different films;

wherein the non-display region comprises a plurality of connection wires;

a touch wire of the touch wires is electrically connected to a connection wire of the connection wires, and a connection wire of the connection wires is electrically connected to a bonding pad of the bonding pads;

the plurality of connection wires are disposed in a same film;

the first touch wires comprise a first touch subwire and a second touch subwire in different films;

the plurality of connection wires comprise a first connection wire and a second connection wire, and the plurality of bonding pads comprise a first bonding pad and a second bonding pad;

the first touch subwire comprises a first wire portion and a second wire portion, wherein the second wire portion is electrically connected to the first wire portion and the first connection wire, and the first connection wire is electrically connected to the first bonding pad;

the second touch subwire is electrically connected to the second connection wire, and the second connection wire is electrically connected to the second bonding pad;

an extension direction of the first wire portion is parallel to an extension direction of the second touch subwire, and along a thickness direction of the display panel, the first wire portion and the second touch subwire at least partially overlap; and the extension direction of the first wire portion intersects an extension direction of the second wire portion.

5. The display panel according to claim 1, wherein the plurality of touch wires further comprise a plurality of second touch wires, the plurality of second touch wires are disposed in the non-display region.

6. The display panel according to claim 5, wherein the plurality of second touch wires comprise a third touch subwire and a fourth touch subwire; and the third touch subwire and the fourth touch subwire are disposed in different films, and along the thickness direction of the display panel, the third touch subwire and the fourth touch subwire at least partially overlap.

7. The display panel according to claim 1, wherein the plurality of touch electrode blocks comprise a plurality of first touch electrode blocks arranged in an array and a plurality of second touch electrode blocks arranged in an array, wherein the first touch electrode blocks and the second touch electrode blocks are spaced apart;

along a row direction, adjacent two first touch electrode blocks are electrically connected to each other to form a plurality of first touch electrodes, the plurality of first touch electrodes extend along the row direction and are arranged along a column direction; and along the column direction, adjacent two second touch electrode blocks are electrically connected to each other to form a plurality of second touch electrodes, the plurality of second touch electrodes extend along the column direction and are arranged along the row direction.

8. The display panel according to claim 7, wherein the display region and the bonding region are arranged along the column direction, and a first touch electrode of the first touch electrodes is electrically connected to a first touch wire of the first touch wires;

the plurality of touch wires further comprise a plurality of second touch wires, wherein the second touch wires are disposed in the non-display region; and a second touch electrode of the second touch electrodes is electrically connected to a second touch wire of the second touch wires.

9. The display panel according to claim 8, wherein the plurality of bonding pads comprise a third bonding pad and a fourth bonding pad;

the bonding region comprises a first bonding region and a second bonding region, wherein along the row direction, the second bonding region is disposed on at least one side of the first bonding region;

the third bonding pad is disposed in the first bonding region, and the fourth bonding pad is disposed in the second bonding region;

one end of one second touch wire of the second touch wires is electrically connected to an end of one second touch electrode of the second touch electrodes facing away from the bonding region, and another end of the one second touch wire of the second touch wires is electrically connected to the fourth bonding pad; and a first touch wire of the first touch wires is electrically connected to the third bonding pad.

10. The display panel according to claim 9, wherein the second bonding region comprises a first bonding subregion and a second bonding subregion; and along the row direction, the first bonding subregion and the second bonding subregion are disposed on two opposite sides of the first bonding region.

11. The display panel according to claim 9, wherein the second touch electrodes comprise a first touch subelectrode and a second touch subelectrode, wherein along the row direction, the first touch subelectrode is disposed on a side of the second touch subelectrode facing away from a first central axis;

the fourth bonding pad comprises a first bonding subpad and a second bonding subpad, wherein along the row direction, the first bonding subpad is disposed on a side of the second bonding subpad facing away from a second central axis;

wherein the first central axis is a central axis of the display region, and an extension direction of the first central axis is parallel to the column direction; the second central axis is a central axis of the bonding region, and an extension direction of the second central axis is parallel to the column direction;

the second touch wires comprise a fifth touch subwire and a sixth touch subwire, wherein the fifth touch subwire is disposed on a side of the sixth touch subwire facing away from the display region;

the fifth touch subwire is electrically connected to the second touch subelectrode and the first bonding subpad; and the sixth touch subwire is electrically connected to the first touch subelectrode and the second bonding subpad.

12. The display panel according to claim 7, wherein along the thickness direction of the display panel, a first touch wire of the first touch wires is disposed in a gap between adjacent two touch electrode blocks.

13. The display panel according to claim 12, wherein the plurality of first touch wires extend along the column direction and are arranged along the row direction; and the plurality of first touch wires are the same in length; or at least two of the first touch wires are different in length; the display region further comprises a plurality of virtual wires disposed in the display region, wherein a virtual wire of the virtual wire is disposed in a gap between adjacent two touch electrode blocks; the virtual wires extend along the column direction and are arranged along the row direction; and the virtual wires and the first touch wires are arranged along the column direction, and the virtual wires are insulated from the first touch wires.

14. A display panel, comprising a plurality of touch electrode blocks and a plurality of touch wires, wherein a touch wire of the plurality of touch wires is electrically connected to at least one touch electrode block of the plurality of touch electrode blocks;

the display panel further comprises a display region and a non-display region disposed on at least one side of the display region, wherein the plurality of touch electrode blocks are disposed in the display region;

the non-display region comprises a bonding region disposed on a side of the display region, and the bonding region comprises a plurality of bonding pads;

the plurality of touch wires comprise a plurality of first touch wires, wherein at least part of a first touch wire of the plurality of first touch wires is disposed in the display region, and a first end of the first touch wire is electrically connected to a touch electrode block of the plurality of touch electrode blocks, and a second end of the first touch wire is electrically connected to a bonding pad of the plurality of bonding pads; and at least two first touch wires of the first touch wires are disposed in different films;

wherein the plurality of touch electrode blocks comprise a plurality of first touch electrode blocks arranged in an array and a plurality of second touch electrode blocks arranged in an array, wherein the first touch electrode blocks and the second touch electrode blocks are spaced apart;

along a row direction, adjacent two first touch electrode blocks are electrically connected to each other to form a plurality of first touch electrodes, the plurality of first touch electrodes extend along the row direction and are arranged along a column direction;

along the column direction, adjacent two second touch electrode blocks are electrically connected to each other to form a plurality of second touch electrodes, the plurality of second touch electrodes extend along the column direction and are arranged along the row direction:

the first touch electrode blocks and the second touch electrode blocks are disposed in a same film, and the display panel further comprises a bridge connection electrode disposed in a different film from the first touch electrode blocks;

along the row direction, two adjacent first touch electrode blocks are electrically connected through the bridge connection electrode; or along the column direction, two adjacent second touch electrode blocks are electrically connected through the bridge connection electrode;

the plurality of touch wires further comprise a plurality of second touch wires, wherein the second touch wires are disposed in the non-display region;

the plurality of second touch wires comprise a third touch subwire and a fourth touch subwire;

the third touch subwire and the fourth touch subwire are disposed in different films, and along a thickness direction of the display panel, the third touch subwire and the fourth touch subwire at least partially overlap; and the third touch subwire is disposed in a same film as one of the first touch electrode blocks and the bridge connection electrode, and the fourth touch subwire is disposed in a same film as another of the first touch electrode blocks and the bridge connection electrode.

15. The display panel according to claim 7, wherein the first touch electrode blocks and the second touch electrode blocks are disposed in different films;

the plurality of touch wires further comprise a plurality of second touch wires, wherein the second touch wires are disposed in the non-display region;

the plurality of second touch wires comprise a third touch subwire and a fourth touch subwire;

the third touch subwire and the fourth touch subwire are disposed in different films, and along the thickness direction of the display panel, the third touch subwire and the fourth touch subwire at least partially overlap; and the third touch subwire is disposed in a same film as one of the first touch electrode blocks and the second touch electrode blocks, and the fourth touch subwire is disposed in a same film as another of the first touch electrode blocks and the second touch electrode blocks.

16. The display panel according to claim 1, wherein a touch wire of the touch wires is electrically connected to a bonding pad of the bonding pads; the plurality of touch electrode blocks comprise a third touch electrode block and a fourth touch electrode block, wherein a distance between the third touch electrode block and the bonding region is greater than a distance between the fourth touch electrode block and the bonding region; and a width of a touch wire electrically connected to the third touch electrode block is larger than a width of a touch wire electrically connected to the fourth touch electrode block.

17. The display panel according to claim 1, wherein the plurality of touch electrode blocks are arranged in an array and are insulated from each other.

18. The display panel according to claim 1, wherein along the thickness direction of the display panel, the first touch wires at least partially overlap the touch electrode blocks.

19. A display device, comprising the display panel of claim 1.

20. The display panel according to claim 4, wherein along the thickness direction of the display panel, the at least two first touch wires disposed in different films at least partially overlap each other.

* * * * *